United States Patent
Lee

(10) Patent No.: US 12,150,299 B2
(45) Date of Patent: Nov. 19, 2024

(54) SEMICONDUCTOR DEVICE AND METHOD OF MANUFACTURING THE SAME

(71) Applicant: SK hynix Inc., Icheon-si (KR)

(72) Inventor: Ki Hong Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 521 days.

(21) Appl. No.: 17/353,505

(22) Filed: Jun. 21, 2021

(65) Prior Publication Data

US 2022/0189983 A1 Jun. 16, 2022

(30) Foreign Application Priority Data

Dec. 10, 2020 (KR) .................. 10-2020-0172681

(51) Int. Cl.
*H10B 41/27* (2023.01)
*H10B 41/10* (2023.01)
*H10B 43/10* (2023.01)
*H10B 43/27* (2023.01)

(52) U.S. Cl.
CPC ............ *H10B 41/27* (2023.02); *H10B 41/10* (2023.02); *H10B 43/10* (2023.02); *H10B 43/27* (2023.02)

(58) Field of Classification Search
CPC ........ H10B 41/27; H10B 41/10; H10B 41/30; H10B 41/35; H10B 43/10; H10B 43/27; H10B 43/35; H10B 43/30; H10B 63/84; H10N 70/01; H01L 29/42324; H01L 29/4234; H01L 29/66825; H01L 29/66833; H01L 29/788; H01L 29/792
See application file for complete search history.

(56) References Cited

U.S. PATENT DOCUMENTS

| | | | |
|---|---|---|---|
| 10,347,654 B1* | 7/2019 | Iwai | H10B 43/10 |
| 11,387,251 B2* | 7/2022 | Kobayashi | H10B 43/27 |
| 2017/0207226 A1* | 7/2017 | Lee | H10B 43/27 |
| 2018/0247949 A1* | 8/2018 | Choi | H10B 41/27 |
| 2019/0393238 A1* | 12/2019 | Lim | H10B 43/35 |
| 2020/0203370 A1* | 6/2020 | Son | H10B 43/27 |
| 2020/0388634 A1* | 12/2020 | Jung | H10B 41/27 |
| 2021/0175241 A1* | 6/2021 | Ryu | H10B 63/34 |
| 2021/0242234 A1* | 8/2021 | Lee | H10B 43/10 |
| 2022/0013534 A1* | 1/2022 | Chandolu | H10B 41/35 |
| 2024/0040787 A1* | 2/2024 | Manthena | H10B 43/10 |

FOREIGN PATENT DOCUMENTS

| | | | |
|---|---|---|---|
| KR | 1020180137272 A | 12/2018 |
| KR | 1020190034864 A | 4/2019 |
| KR | 1020190058079 A | 5/2019 |
| KR | 1020190123050 A | 10/2019 |
| KR | 1020190125811 A | 11/2019 |
| KR | 1020190143691 A | 12/2019 |
| KR | 1020200078784 A | 7/2020 |

* cited by examiner

Primary Examiner — Calvin Y Choi
Assistant Examiner — Linda J. Fleck
(74) Attorney, Agent, or Firm — WILLIAM PARK & ASSOCIATES LTD.

(57) ABSTRACT

A semiconductor device, and a method of manufacturing the semiconductor device, includes a first source layer, a second source layer, a first insulating passivation layer partially interposed between the first source layer and the second source layer, and a gate structure located on the second source layer. The semiconductor device also includes a source contact structure passing through the gate structure, the second source layer, and the first insulating passivation layer. The source contact structure is coupled to the first source layer.

15 Claims, 35 Drawing Sheets

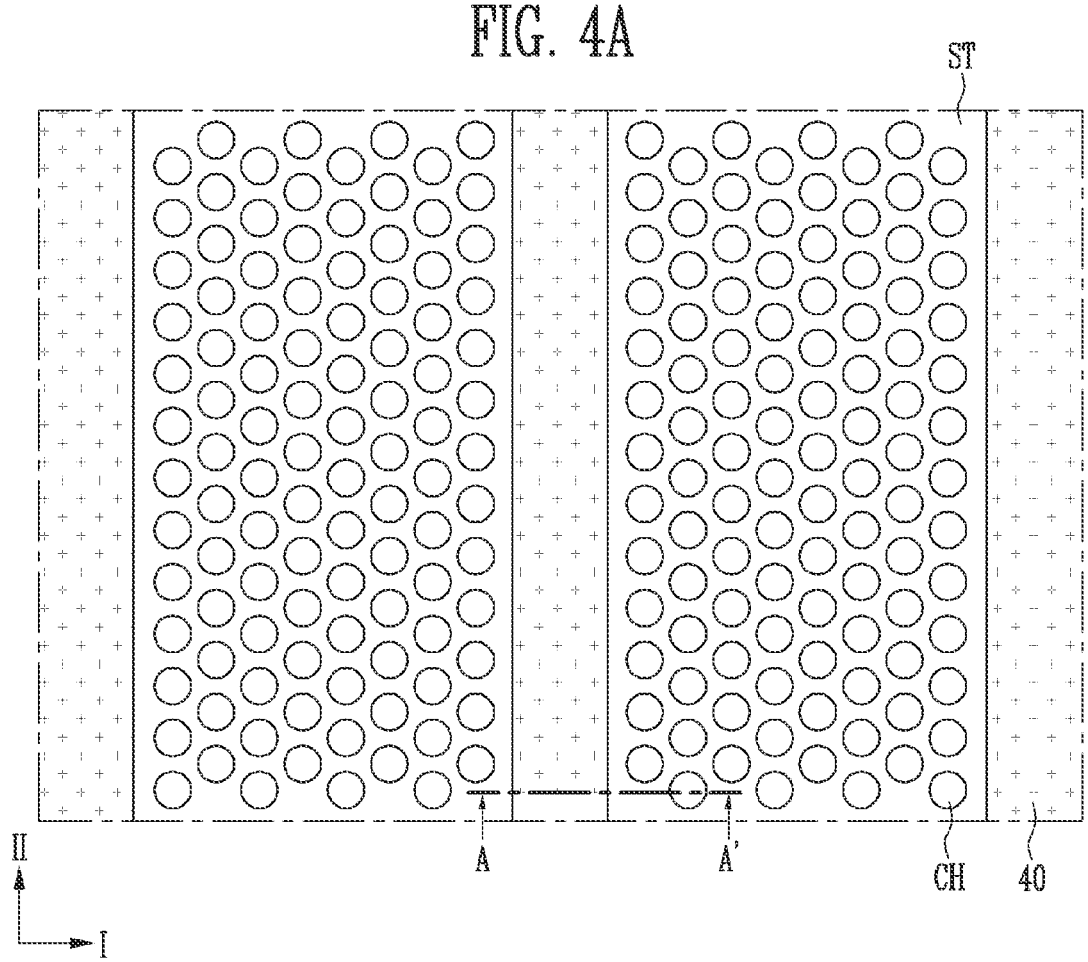

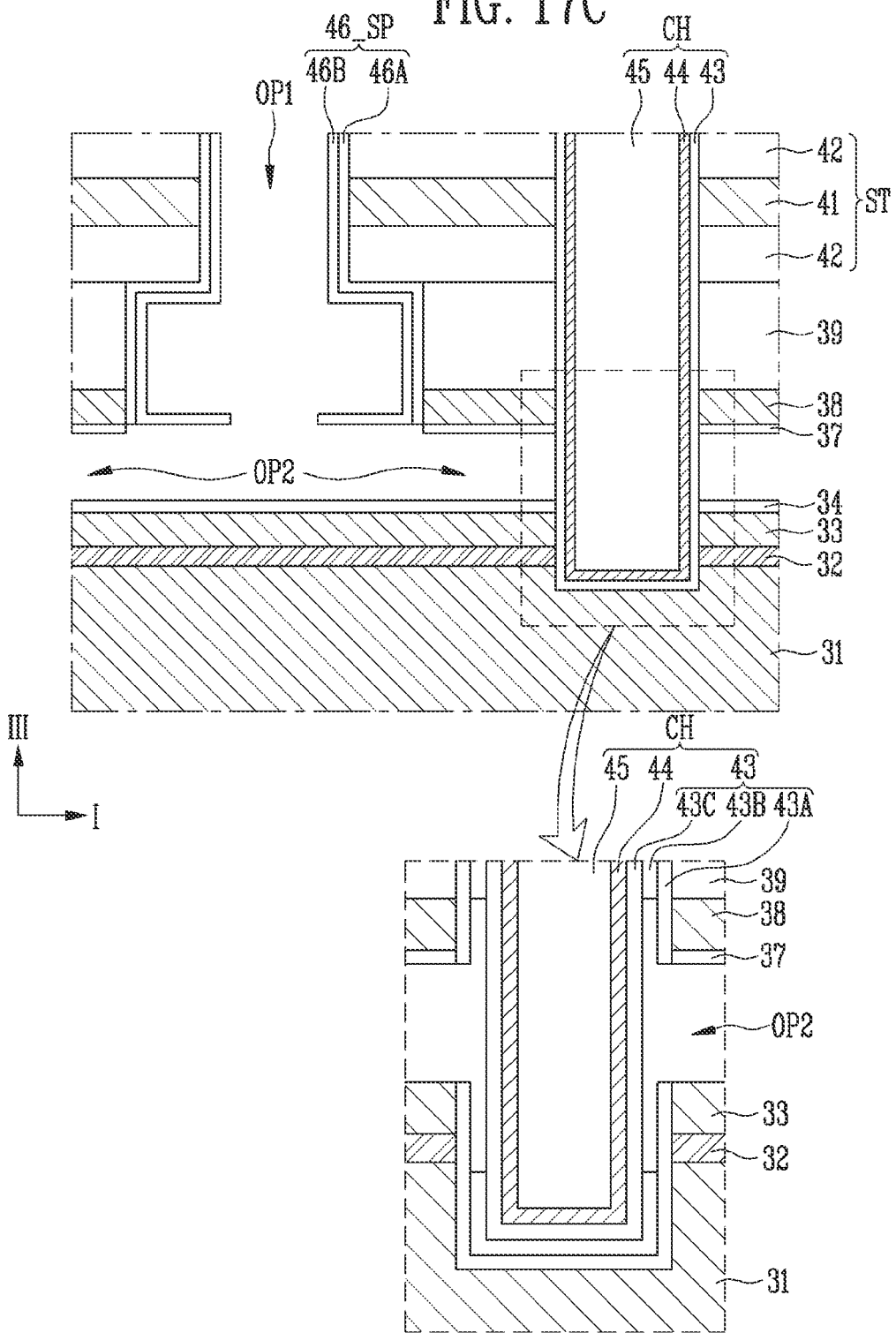

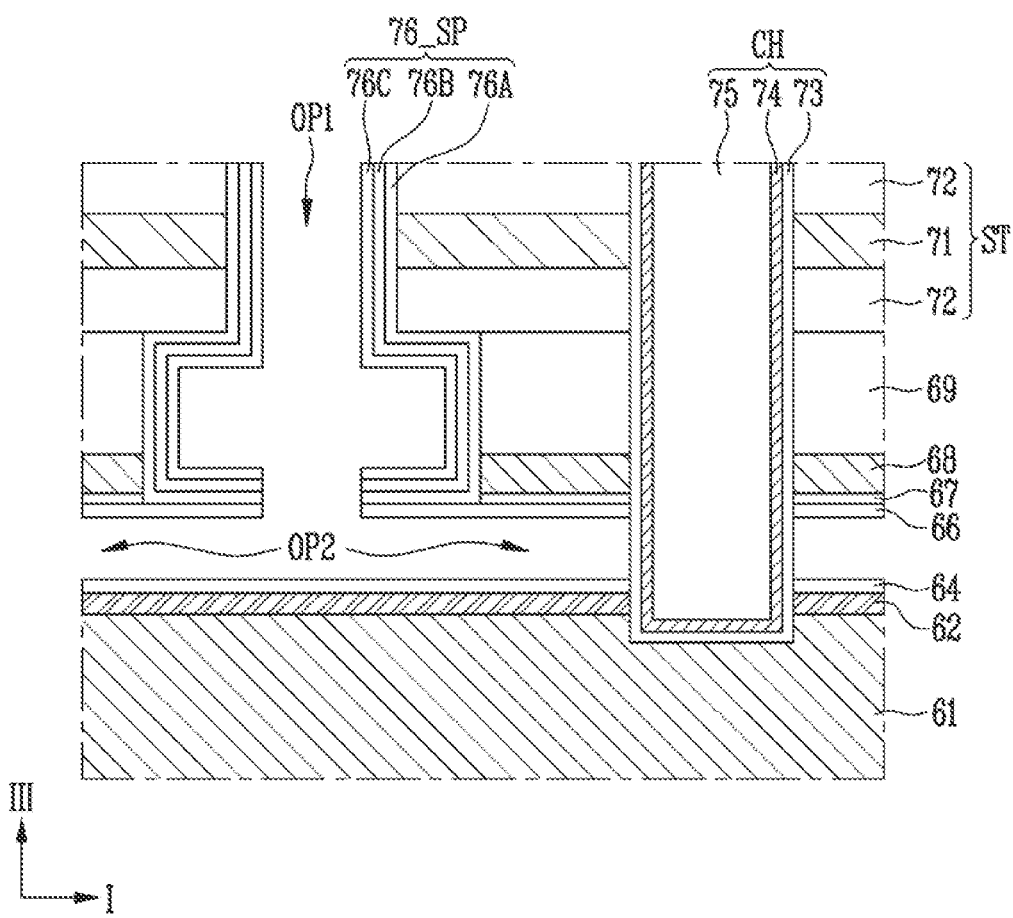

SEMICONDUCTOR DEVICE AND METHOD OF MANUFACTURING THE SAME

CROSS-REFERENCE TO RELATED APPLICATION

The present application claims priority under 35 U.S.C. § 119(a) to Korean patent application number 10-2020-0172681 filed on Dec. 10, 2020, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor device and a method of manufacturing the semiconductor device.

2. Related Art

The integration of a semiconductor device is mainly determined by an area occupied by a unit memory cell. Recently, as the improvement of the integration of semiconductor devices including memory cells formed on a substrate in a single layer is limited, three-dimensional semiconductor devices including memory cells stacked on a substrate have been proposed. Furthermore, in order to improve the operational reliability of such semiconductor devices, various structures and manufacturing methods have been developed.

SUMMARY

Various embodiments of the present disclosure are directed to a semiconductor device which has a stable structure and improved characteristics, and a method of manufacturing the same.

An embodiment of the present disclosure may provide for a semiconductor device including a first source layer, a second source layer, a first insulating passivation layer partially interposed between the first source layer and the second source layer, and a gate structure located on the second source layer. The semiconductor device also includes a source contact structure passing through the gate structure, the second source layer, and the first insulating passivation layer. The source contact structure is coupled to the first source layer.

An embodiment of the present disclosure may provide for a semiconductor device including a source structure, a gate structure, and an interlayer insulating layer interposed between the source structure and the gate structure. The semiconductor device also includes a source contact structure passing through the gate structure and the interlayer insulating layer, the source contact structure coupled to the source structure. The source contact structure may include a first portion passing through the gate structure, a second portion passing through the interlayer insulating layer, and a third portion passing through the source structure, wherein the third portion is wider than the first portion, and a void is included in the third portion.

An embodiment of the present disclosure may provide for a method of manufacturing a semiconductor device, the method including forming a first source layer, forming a first insulating passivation layer on the first source layer, and forming a sacrificial structure on the first insulating passivation layer. The method also includes forming a stack on the sacrificial structure, the stack including first material layers and second material layers which are alternately stacked. The method further includes forming a first opening passing through the stack, forming a second opening coupled to the first opening by removing the sacrificial structure, forming a third opening passing through the first insulating passivation layer and exposing the first source layer, forming a second source layer in the second opening and the third opening, and replacing the first material layers with third material layers through the first opening.

BRIEF DESCRIPTION OF THE DRAWINGS

FIGS. 4A, 4B, 5A, 5B, and 6 to 16 are views illustrating a method of manufacturing a semiconductor device in accordance with an embodiment of the present disclosure.

FIGS. 17A to 17E are views illustrating a method of manufacturing a semiconductor device in accordance with an embodiment of the present disclosure.

FIGS. 18A to 18F are views illustrating a method of manufacturing a semiconductor device in accordance with an embodiment of the present disclosure.

DETAILED DESCRIPTION

Specific structural or functional descriptions of embodiments of the present disclosure introduced in this specification or application are only for description of the embodiments. The descriptions should not be construed as being limited to the embodiments described in the specification or application.

Figure 1A:
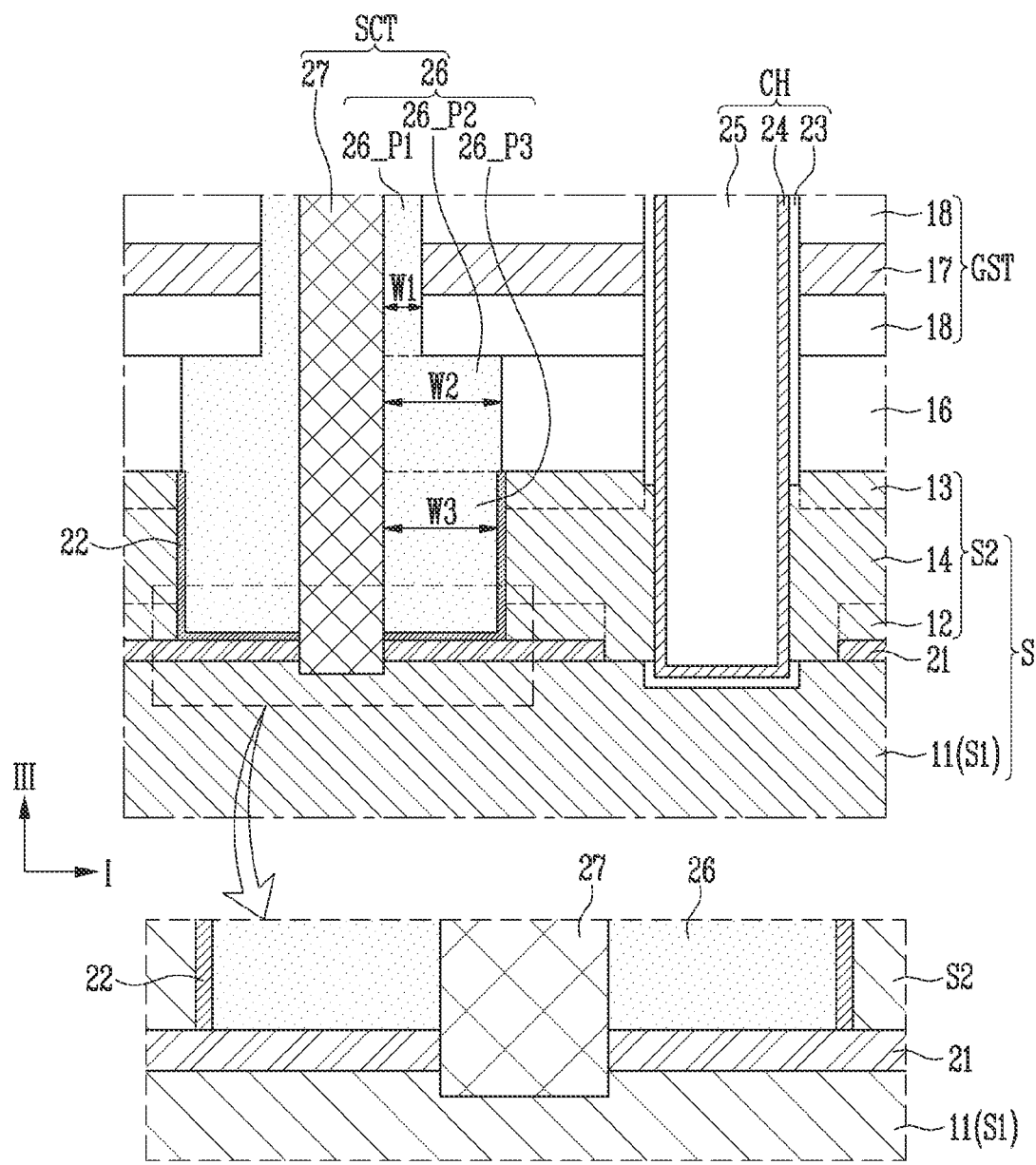
FIGS. 1A and 1B are views illustrating the structure of a semiconductor device in accordance with an embodiment of the present disclosure.
Figure 1B:
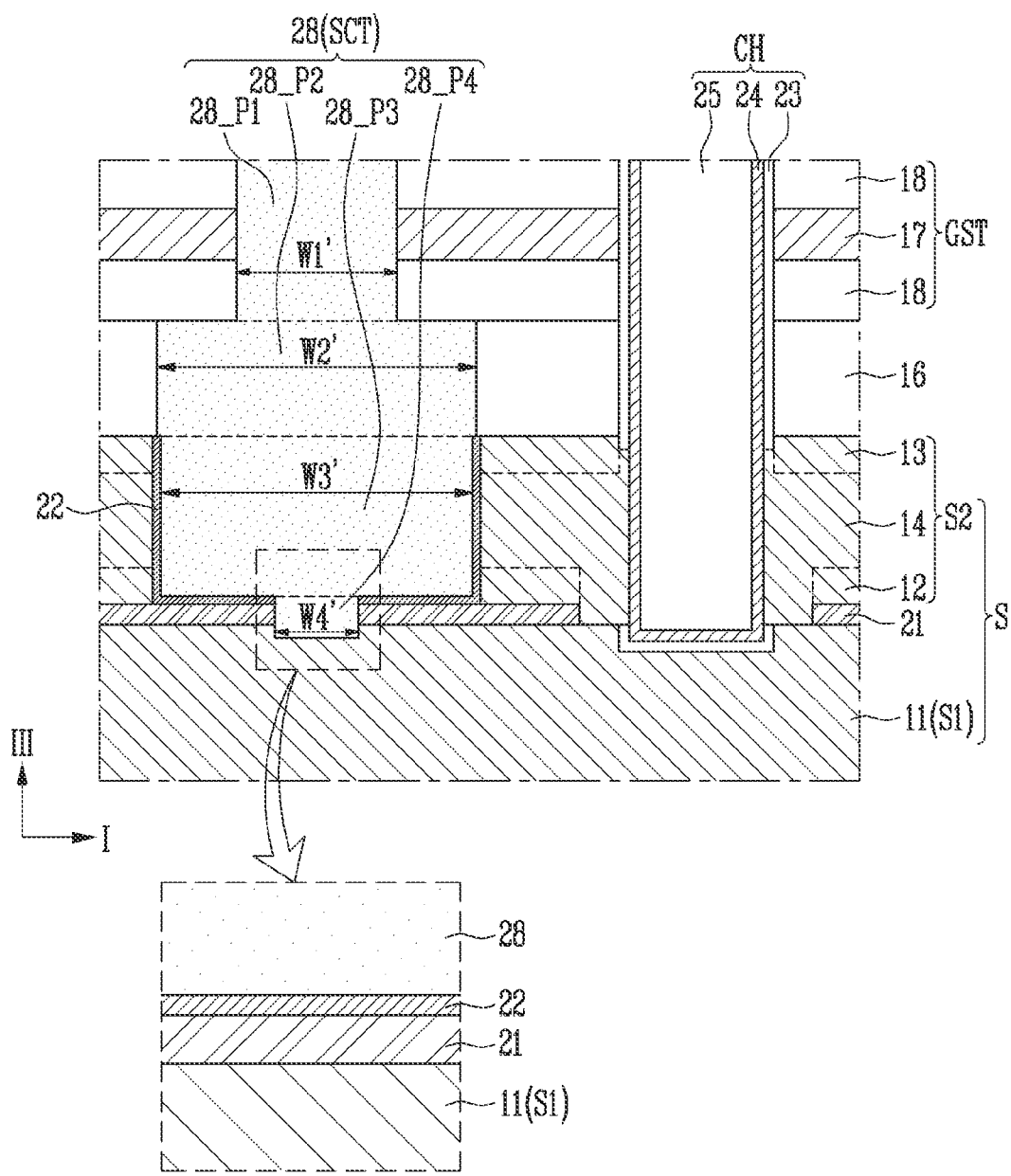

FIGS. 1A and 1B are views illustrating the structure of a semiconductor device in accordance with an embodiment of the present disclosure.

Referring to FIGS. 1A and 1B, the semiconductor device may include a source structure S, a gate structure GST, and a source contact structure SCT. The semiconductor device may further include an interlayer insulating layer 16, a second insulating passivation layer 22, or a channel structure CH, and may further include a combination thereof.

The source structure S may include a first source layer S1 and a second source layer S2, and may further include a first insulating passivation layer 21. The first source layer S1 may include a first layer 11. The first layer 11 may be a polysilicon layer or a metal layer such as tungsten or molybdenum. The second source layer S2 may include a second layer 12, a third layer 13, or a fourth layer 14, or may include a combination thereof. The fourth layer 14 may be interposed between the second layer 12 and the third layer 13. The second layer 12, the third layer 13, or the fourth layer 14 may be a polysilicon layer or a metal layer such as tungsten or molybdenum.

The first source layer S1 or the second source layer S2 may include a dopant. The dopant may include an N-type impurity or a P-type impurity. The dopant concentration of the first source layer S1 and the dopant concentration of the second source layer S2 may be substantially equal to or different from each other. The dopant concentrations of the second to fourth layers 12 to 14 may be substantially equal to or different from each other.

The first insulating passivation layer 21 may be partially interposed between the first source layer S1 and the second source layer S2. The first insulating passivation layer 21 may serve to protect the first source layer S1 during a manufacturing process. The first insulating passivation layer 21 may include an insulating material such as an oxide or nitride.

The first insulating passivation layer 21 may be spaced apart from a sidewall of the channel structure CH. In the periphery of the source contact structure SCT, the first insulating passivation layer 21 may be interposed between the first source layer S1 and the second source layer S2. In the periphery of the channel structure CH, the first insulating passivation layer 21 might not be interposed between the first source layer S1 and the second source layer S2. In the periphery of the channel structure CH, the second source layer S2 may pass through the first insulating passivation layer 21 to be electrically coupled to the first source layer.

The gate structure GST may be located on the source structure S. The gate structure GST may include conductive layers 17 and insulating layers 18 which are alternately stacked. The lowermost layer of the gate structure GST may be the insulating layer 18, as illustrated, or the conductive layer 17. The conductive layers 17 may be gate electrodes such as a memory cell or a select transistor. The conductive layers 17 may include a conductive material such as polysilicon, tungsten, molybdenum, or metal. The insulating layers 18 serve to insulate the stacked conductive layers 17 from each other. The insulating layers 18 may include insulating material such as an oxide, nitride, or air gap.

The interlayer insulating layer 16 may be interposed between the source structure S and the gate structure GST. In an embodiment, the interlayer insulating layer 16 may be interposed between the second source layer S2 and the gate structure GST. The interlayer insulating layer 21 may include an insulating material such as an oxide or nitride. In an embodiment, the interlayer insulating layer 16 may include a silicon oxide layer.

The channel structure CH may pass through the gate structure GST, the interlayer insulating layer 16, the second source layer S2, and the first insulating passivation layer 21, and may extend to the first source layer S1. The channel structure CH may include a channel layer 24, and the channel layer 24 may pass through the gate structure GST, the interlayer insulating layer 16, the second source layer S2, and the first insulating passivation layer 21. The second source layer S2 may pass through a memory layer 23 of the channel structure CH and be directly coupled to the channel layer 24. The channel layer 24 may include a semiconductor material such as silicon, germanium, or nanostructure.

The channel structure CH may further include the memory layer 23 or an insulating core 25, or may further include a combination thereof. The memory layer 23 may be interposed between the channel layer 24 and the conductive layers 17. In an embodiment, the memory layer 23 may be formed to enclose a sidewall of the channel layer 24. The memory layer 23 may include a tunnel insulating layer, a data storage layer, or a blocking layer, or may include a combination thereof. The data storage layer may include a floating gate, a charge trap material, polysilicon, nitride, a variable resistance material, a phase change material, and the like, or may include a combination thereof. The insulating core 25 may be formed in the channel layer 24. The insulating core 25 may include an insulating material such as an oxide, nitride, or air gap.

The source contact structure SCT may pass through the gate structure GST, the interlayer insulating layer 16, the second source layer S2, and the first insulating passivation layer 21. The source contact structure SCT may be coupled to the first source layer S1. The source contact structure SCT may include a conductive material, an insulating material, or a combination thereof.

The second insulating passivation layer 22 may be interposed between the source contact structure SCT and the source structure S. In an embodiment, the second insulating passivation layer 22 may be interposed between the source contact structure SCT and the second source layer S2. In an embodiment, the second insulating passivation layer 22 may be interposed between an insulating spacer 26 and the second source layer S2, and may extend between the insulating spacer 26 and the first insulating passivation layer 21. In an embodiment, the second insulating passivation layer 22 may be interposed between the insulating spacer 26 and the second source layer S2, and might not be interposed between the insulating spacer 26 and the first insulating passivation layer 21. The second insulating passivation layer 22 may be spaced apart from the first source layer S1.

The second insulating passivation layer 22 may be used to protect either the first source layer S1 or the second source layer S2, or both the first source layer S1 and the second source layer S2 during the manufacturing process. The second insulating passivation layer 22 may include an insulating material such as an oxide or nitride.

Referring to FIG. 1A, the source contact structure SCT may include a conductive source contact layer 27 and an insulating spacer 26. The conductive source contact layer 27 may pass through the second insulating passivation layer 22 and the first insulating passivation layer 21, and may be electrically coupled to the first source layer S1. The insulating spacer 26 may be used to insulate the conductive source contact layer 27 and the conductive layers 17 from each other. In an embodiment, the insulating spacer 26 may be formed to enclose a sidewall of the conductive source contact layer 27.

The insulating spacer 26 may include a first portion 26_P1, a second portion 26_P2, and a third portion 26_P3. The first portion 26_P1 may be interposed between the conductive source contact layer 27 and the gate structure GST. The second portion 26_P2 may be interposed between the conductive source contact layer 27 and the interlayer insulating layer 16. The third portion 26_P3 may be interposed between the conductive source contact layer 27 and the second source layer S2. A width W1 of the first portion 26_P1, a width W2 of the second portion 26_P2, and a width W3 of the third portion 26_P3 may be substantially the same or different. The width W2 of the second portion 26_P2 may be wider than the width W1 of the first portion 26_P1. The width W3 of the third portion 26_P3 may be wider than the width W1 of the first portion 26_P1. The width W3 of the third portion 26_P3 may be narrower than the width W2 of the second portion 26_P2.

For reference, FIG. 1A illustrates that the conductive source contact layer 27 has a uniform width in the first direction I and has a length in the third direction III. However, the width may be changed. Although FIG. 1A illustrates that the insulating spacer 26 has the first to third widths W1 to W3, the insulating spacer 26 may have a uniform width. In an embodiment, a portion of the conductive source contact layer 27 corresponding to the second portion 26_P2 or the third portion 26_P3 may be wider in width than a portion thereof corresponding to the first portion 26_P1. Furthermore, the conductive source contact layer 27 may include a void located in a portion having a wide width.

Referring to FIG. 1B, the source contact structure SCT may be formed of an insulating material. The source contact structure SCT may include an insulating layer 28. The insulating layers 28 may include an insulating material such as an oxide, nitride, or air gap.

The insulating layer 28 may include a first portion 28_P1, a second portion 28_P2, and a third portion 28_P3, and may further include a fourth portion 28_P4. The first portion 28_P1 may be a portion passing through the gate structure GST. The second portion 28_P2 may be a portion passing through the interlayer insulating layer 16. The third portion 28_P3 may be a portion passing through the second source layer S2. The fourth portion 28_P4 may be a portion passing through the second insulating passivation layer 22 and the first insulating passivation layer 21. The fourth portion 28_P4 may be coupled to the first source layer S1. In an embodiment, the insulating layer 28 might not include the fourth portion 28_P4, and the second insulating passivation layer 22 may be formed to enclose a lower surface of the insulating layer 28. In this case, the insulating layer 28 may be spaced apart from the first source layer S1 and the first insulating passivation layer 21.

A width W1' of the first portion 28_P1, a width W2' of the second portion 28_P2, and a width W3' of the third portion 28_P3 may be substantially the same or different. The width W2' of the second portion 28_P2 may be wider than the width W1' of the first portion 28_P1. The width W3' of the third portion 28_P3 may be wider than the width W1' of the first portion 28_P1. The width W3' of the third portion 28_P3 may be narrower than the width W2' of the second portion 28_P2. The width W4' of the fourth portion 28_P4 may be narrower than that of the first portion 28_P1, the second portion 28_P2, or the third portion 28_P3. In an embodiment, when the second portion 28_P2 and the third portion 28_P3 are wider in width than the first portion 28_P1 and the fourth portion 28_P4, the second portion 28_P2 or the third portion 28_P3 may include a void therein.

In the above-described structure, the memory cell or the select transistor may be located in a portion where the channel structure CH and the conductive layers 17 intersect with each other. The memory cells may be stacked along the channel structure CH. Furthermore, it is possible to prevent the first source layer S1 and the second source layer S2 from being damaged during the manufacturing process, and the first source layer S1 and the second source layer S2 each may have a substantially flat surface.

Figure 2A:
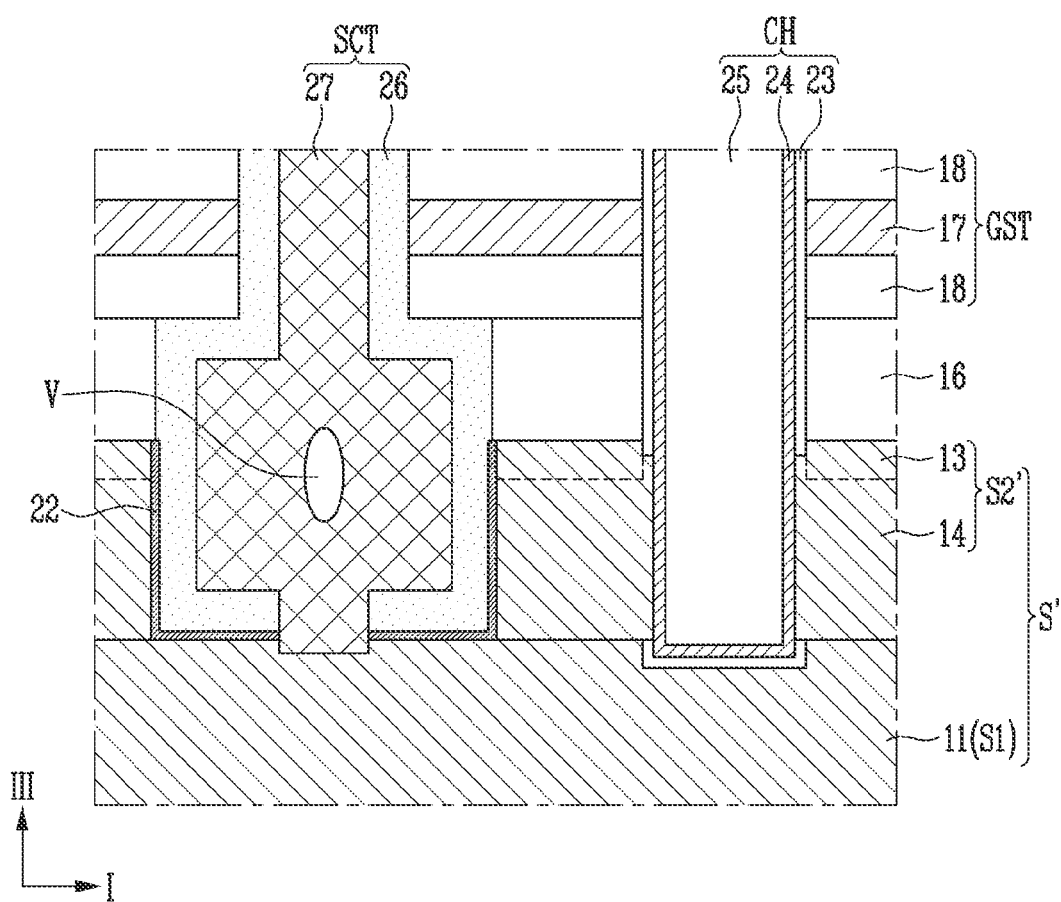
FIGS. 2A and 2B are views illustrating the structure of a semiconductor device in accordance with an embodiment of the present disclosure.
Figure 2B:
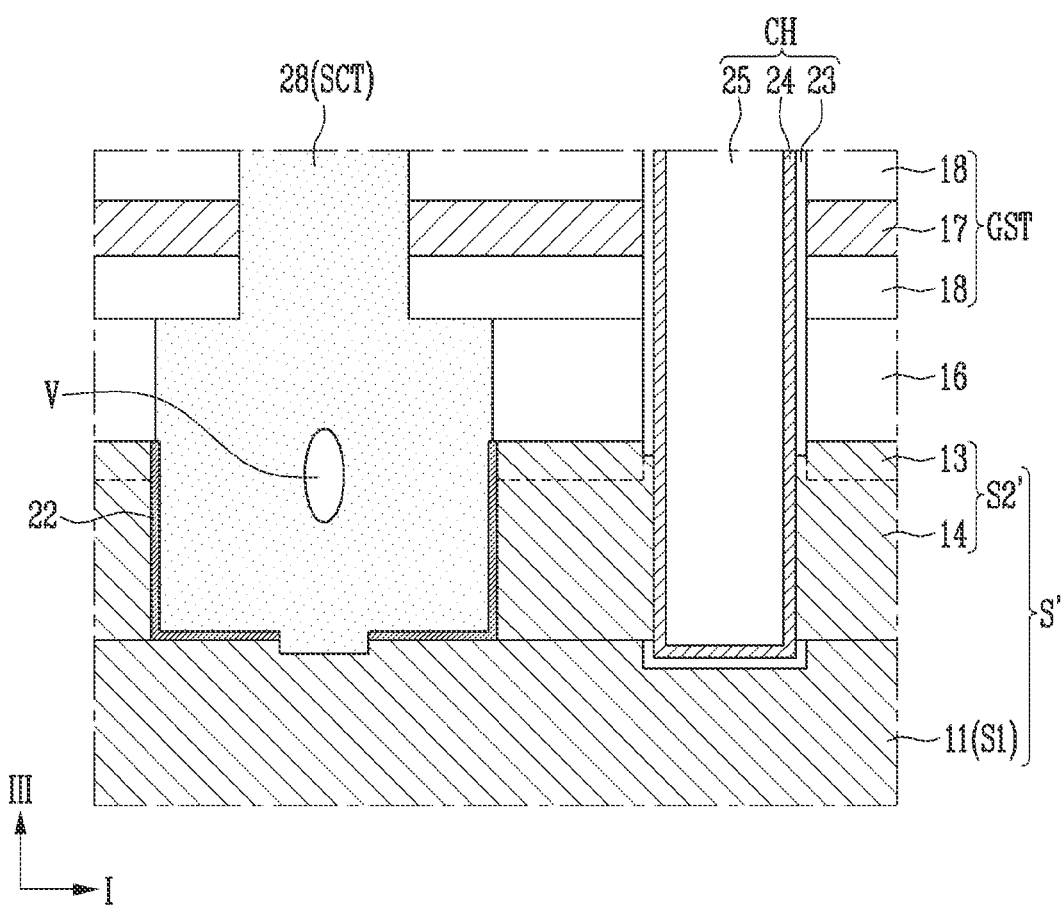

FIGS. 2A and 2B are views illustrating the structure of a semiconductor device in accordance with an embodiment of the present disclosure. Hereinbelow, repetitive explanation will be omitted if deemed redundant.

Referring to FIGS. 2A and 2B, the semiconductor device may include a source structure S, a gate structure GST, and a source contact structure SCT. The semiconductor device may further include an interlayer insulating layer 16, a second insulating passivation layer 22, or a channel structure CH, and may further include a combination thereof.

The source structure S' may include a first source layer S1 and a second source layer S2'. The first source layer S1 may include a first layer 11. The first layer 11 may be a polysilicon layer or a metal layer such as tungsten or molybdenum. The second source layer S2' may include a third layer 13 or a fourth layer 14, or may include a combination thereof. The fourth layer 14 may be interposed between the first layer 11 and the third layer 13. The third layer 13 or the fourth layer 14 may be a polysilicon layer or a metal layer such as tungsten or molybdenum.

The gate structure GST may be located on the source structure S'. The gate structure GST may include conductive layers 17 and insulating layers 18 which are alternately stacked. The interlayer insulating layer 16 may be interposed between the source structure S' and the gate structure GST.

The channel structure CH may pass through the gate structure GST, the interlayer insulating layer 16, and the second source layer S2, and may extend to the first source layer S1. The channel structure CH may include a channel layer 24. The channel structure CH may further include a memory layer 23, or an insulating core 25, or may further include a combination thereof.

The source contact structure SCT may pass through the gate structure GST, the interlayer insulating layer 16, and the second source layer S2'. The source contact structure SCT may be coupled to the first source layer S1.

The second insulating passivation layer 22 may be interposed between the source contact structure SCT and the source structure S'. In an embodiment, the second insulating passivation layer 22 may be interposed between the source contact structure SCT and the first source layer S1 and between the source contact structure SCT and the second source layer S2'. The second insulating passivation layer 22 may be in contact with the first source layer S1.

Referring to FIG. 2A, the source contact structure SCT may include a conductive source contact layer 27 and an insulating spacer 26. The conductive source contact layer 27 may pass through the second insulating passivation layer 22, and may be electrically coupled to the first source layer S1. A portion of the conductive source contact layer 27 passing through the interlayer insulating layer 16 or a portion thereof passing through the source structure S' may be wider than a portion thereof passing through the gate structure GST. Furthermore, the conductive source contact layer 27 may include a void in a portion having a relatively wider width. The void V is an empty space that is not filled with a conductive material, and may be filled with air or the like.

Referring to FIG. 2B, the source contact structure SCT may include an insulating layer 28. A portion of the insulating layer 28 passing through the interlayer insulating layer 16 or a portion thereof passing through the source structure S' may be wider than a portion thereof passing through the gate structure GST. Furthermore, the insulating layer 28 may include a void in a portion having a relatively wider width.

In the above-described structure, the memory cell or the select transistor may be located in a portion where the channel structure CH and the conductive layers 17 intersect with each other. The memory cells may be stacked along the channel structure CH. Furthermore, it is possible to prevent the first source layer S1 and the second source layer S2' from being damaged during the manufacturing process, and the first source layer S1 and the second source layer S2' each may have a substantially flat surface.

Figure 3A:
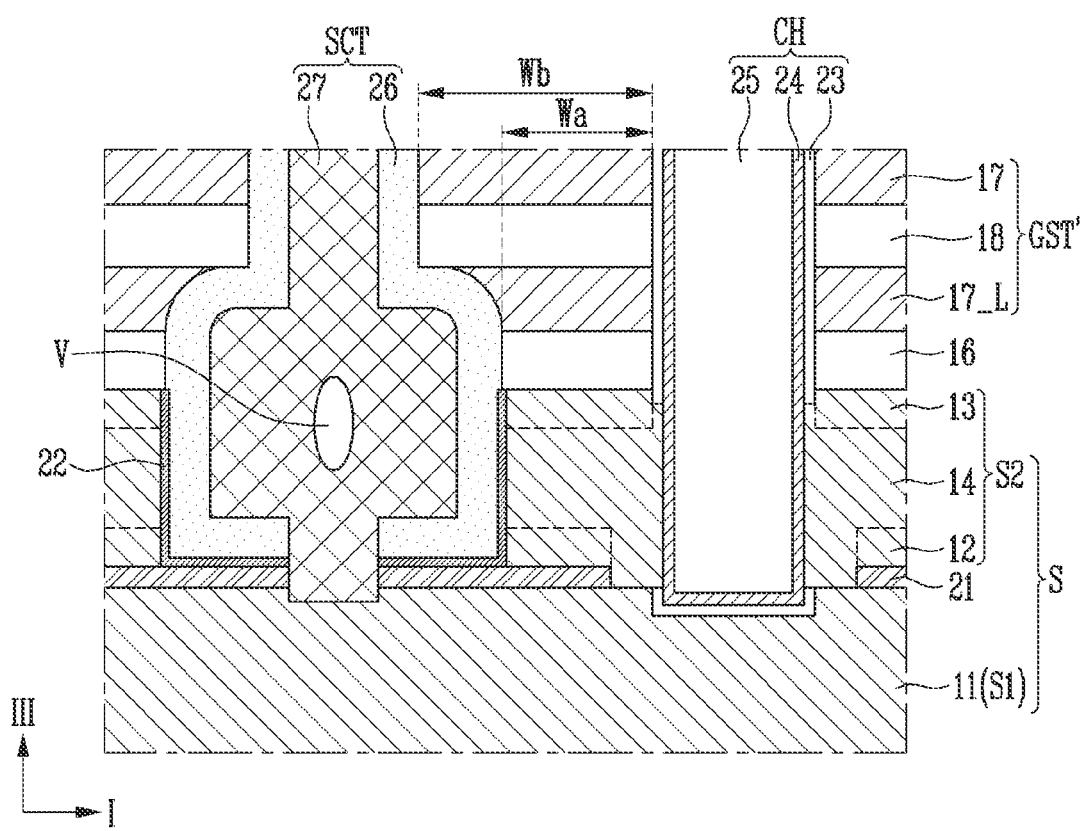
FIGS. 3A and 3B are views illustrating the structure of a semiconductor device in accordance with an embodiment of the present disclosure.
Figure 3B:
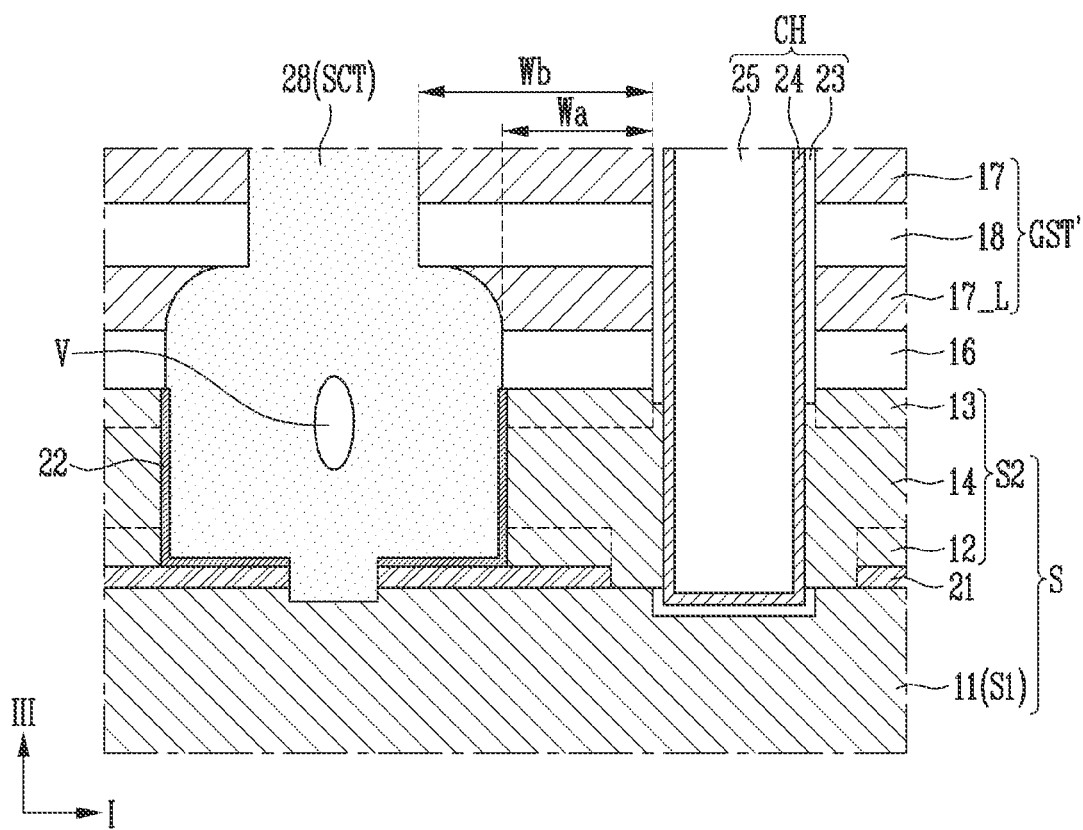

FIGS. 3A and 3B are views illustrating the structure of a semiconductor device in accordance with an embodiment of the present disclosure. Hereinbelow, repetitive descriptions are omitted.

Referring to FIGS. 3A and 3B, the semiconductor device may include a source structure S, a gate structure GST, and a source contact structure SCT. The semiconductor device may further include an interlayer insulating layer 16, a second insulating passivation layer 22, or a channel structure CH, and may further include a combination thereof. The source contact structure SCT may include a void. For reference, although FIGS. 3A and 3B illustrate that the source structure S includes a second layer 12 and the first insulating passivation layer 21, the present disclosure is not limited thereto. The second source layer S2 may or may not include the second layer 12. The source structure S may or may not include the first insulating passivation layer 21.

The gate structure GST' may include conductive layers 17 and insulating layers 18 which are alternately stacked. The lowermost layer of the gate structure GST may be the conductive layer 17. The lowermost conductive layer 17_L may have a width narrower than those of the remaining conductive layers 17. In an embodiment, a width of a portion of the source contact structure SCT passing through the lowermost conductive layer 17_L may be wider than that of a portion passing through the remaining conductive layers 17. Between the channel structure CH and the source contact structure SCT, a width Wa of the lowermost conductive layer 17_L may be narrower than a width Wb of the remaining conductive layers 17. A sidewall of the lowermost conductive layer 17_L may include a curved surface. The sidewall of the lowermost conductive layer 17_L may include a tail extending toward the source contact structure SCT.

Figure 4B:
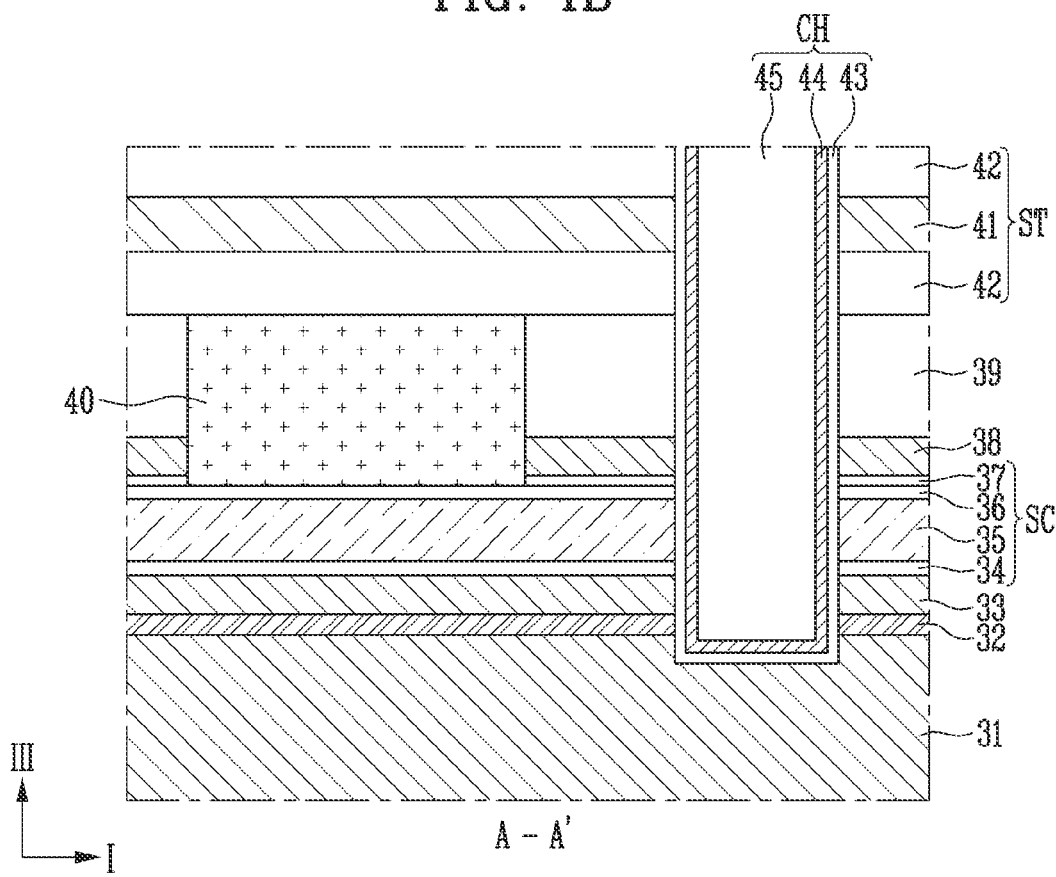
Figure 5A:
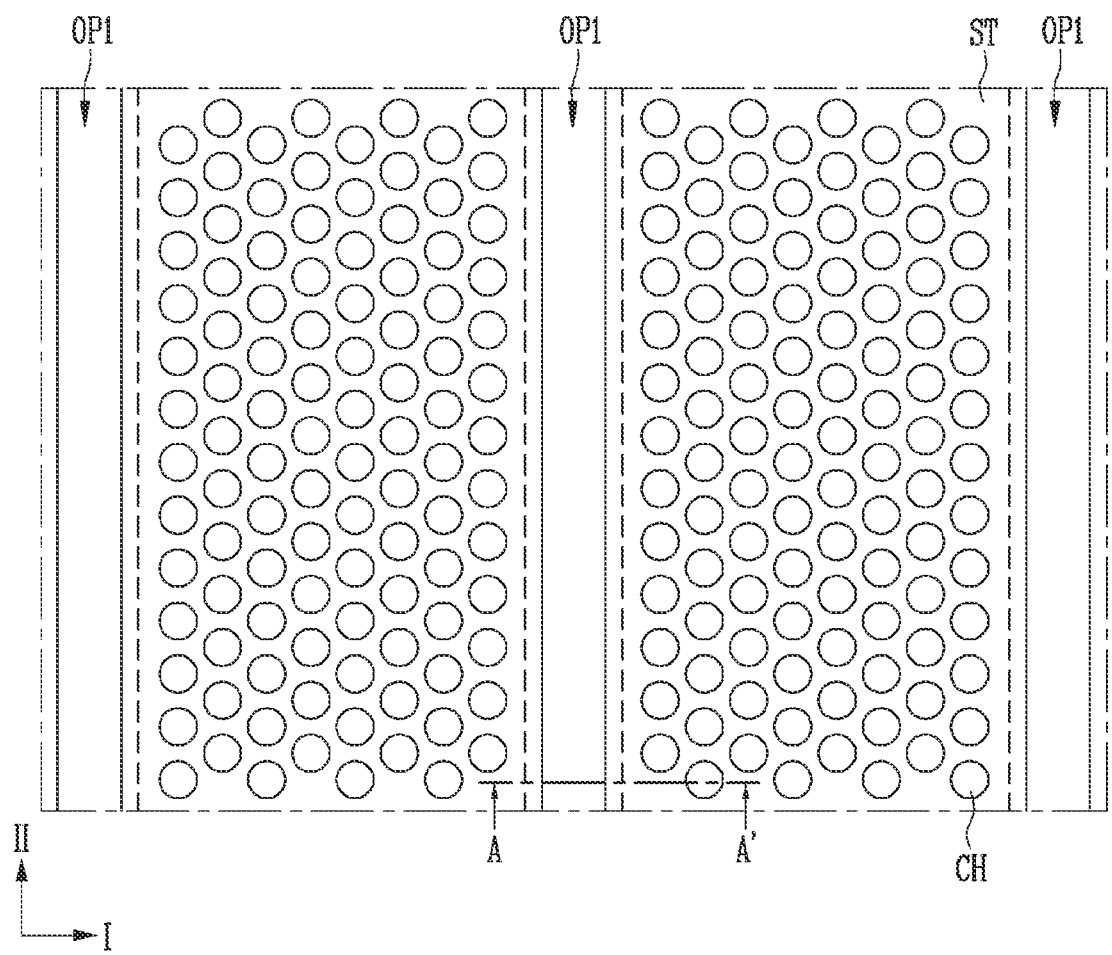

FIGS. 4A, 4B, 5A, 5B, and 6 to 16 are views illustrating a method of manufacturing a semiconductor device in accordance with an embodiment of the present disclosure. FIGS. 4A and 5A may be plan views, and FIGS. 4B and 5B may be sectional views taken along line A-A' of FIGS. 4A and 5A. FIGS. 6 to 16 are sectional views taken in a first direction I-I'. Hereinbelow, repetitive descriptions are omitted.

Referring to FIGS. 4A and 4B, a first source layer 31 is formed. The first source layer 31 may include polysilicon. In an embodiment, the first source layer 31 may be polysilicon doped with N-type or P-type impurities.

Subsequently, a first insulating passivation layer 32 is formed on the first source layer 31. The first insulating passivation layer 32 may include an insulating material such as an oxide or nitride. In an embodiment, the first insulating passivation layer 32 may be a silicon oxide layer.

Subsequently, a first preliminary source layer 33 may be formed on the first insulating passivation layer 32. The first preliminary source layer 33 may include a doped polysilicon layer or an undoped polysilicon layer.

Subsequently, a sacrificial structure SC is formed on the first preliminary source layer 33. The sacrificial structure SC may have a single layer structure or a multilayer structure. The sacrificial structure SC may include a first sacrificial layer 34, a second sacrificial layer 35, a third sacrificial layer 36, or a fourth sacrificial layer 37, or may include a combination thereof. In an embodiment, the first sacrificial layer 34 may be a nitride layer including silicon nitride or the like. The second sacrificial layer 35 may be a doped polysilicon layer or an undoped polysilicon layer. The third sacrificial layer 36 may be a nitride layer including silicon nitride or the like. The fourth sacrificial layer 37 may be an oxide layer including silicon oxide or the like.

Subsequently, a second preliminary source layer 38 may be formed on the sacrificial structure SC. The second preliminary source layer 38 may include a doped polysilicon layer or an undoped polysilicon layer. Subsequently, an interlayer insulating layer 39 may be formed on the second preliminary source layer 38. The interlayer insulating layer 39 may include an insulating material such as an oxide or nitride.

Subsequently, an etch stop layer 40 may be formed. The etch stop layer 40 may pass through the interlayer insulating layer 39. The etch stop layer 40 may further pass through the second preliminary source layer 38, or may further pass through the second preliminary source layer 38 and the fourth sacrificial layer 37. The etch stop layer 40 may be formed to correspond to a position where a first opening is to be formed in a subsequent process. The etch stop layer 40 may include a line pattern extending in a second direction II. The line pattern may have a width in the first direction I and a length in the second direction II. The width in the first direction I may be wider than the width of the first opening which is to be formed in the subsequent process. The second direction II may be a direction intersecting with the first direction I. In an embodiment, the second direction II may be perpendicular to the first direction I. The etch stop layer 40 may include a material having a high etch selectivity with respect to first and second material layers formed in a subsequent process.

Subsequently, a stack ST is formed on the interlayer insulating layer 39. The stack ST may include first material layers 41 and second material layers 42 that are alternately stacked. The first material layers 41 may include a material having a high etch selectivity with respect to the second material layers 42. In an embodiment, the first material layers 41 may include a sacrificial material such as nitride, and the second material layers 42 may include an insulating material such as an oxide. In an embodiment, the first material layers 41 may include a conductive material such as polysilicon, tungsten, or molybdenum, and the second material layers 42 may include an insulating material such as an oxide. The first material layer 41 or the second material layer 42, as is illustrated, may be first deposited on the interlayer insulating layer 39.

Subsequently, a channel structure CH is formed. Channel structures CH may be formed between the etch stop layers 40. The channel structures CH may be arranged in a matrix form or in a staggered form in which the center is offset. The channel structures CH may be symmetrically or asymmetrically arranged on both sides with the etch stop layer 40 interposed therebetween.

The channel structure CH may include a channel layer 44. The channel layer 44 may pass through the stack ST, the sacrificial structure SC, and the first insulating passivation layer 32. The channel layer 44 may further pass through the interlayer insulating layer 39, the second preliminary source layer 38, and the first preliminary source layer 33. The channel layer 44 may extend to the first source layer 31. The channel structure CH may further include a memory layer 43 or an insulating core 45, or may further include a combination thereof.

In an embodiment, an opening passing through the stack ST, the interlayer insulating layer 39, the second preliminary source layer 38, the sacrificial structure SC, the first preliminary source layer 33, and the first insulating passivation layer 32 is formed. The opening may be formed to a depth exposing the first source layer 31. Subsequently, the memory layer 43 is formed in the opening, the channel layer 44 is formed in the memory layer 43, and the insulating core 45 is formed in the channel layer 44.

Figure 5B:
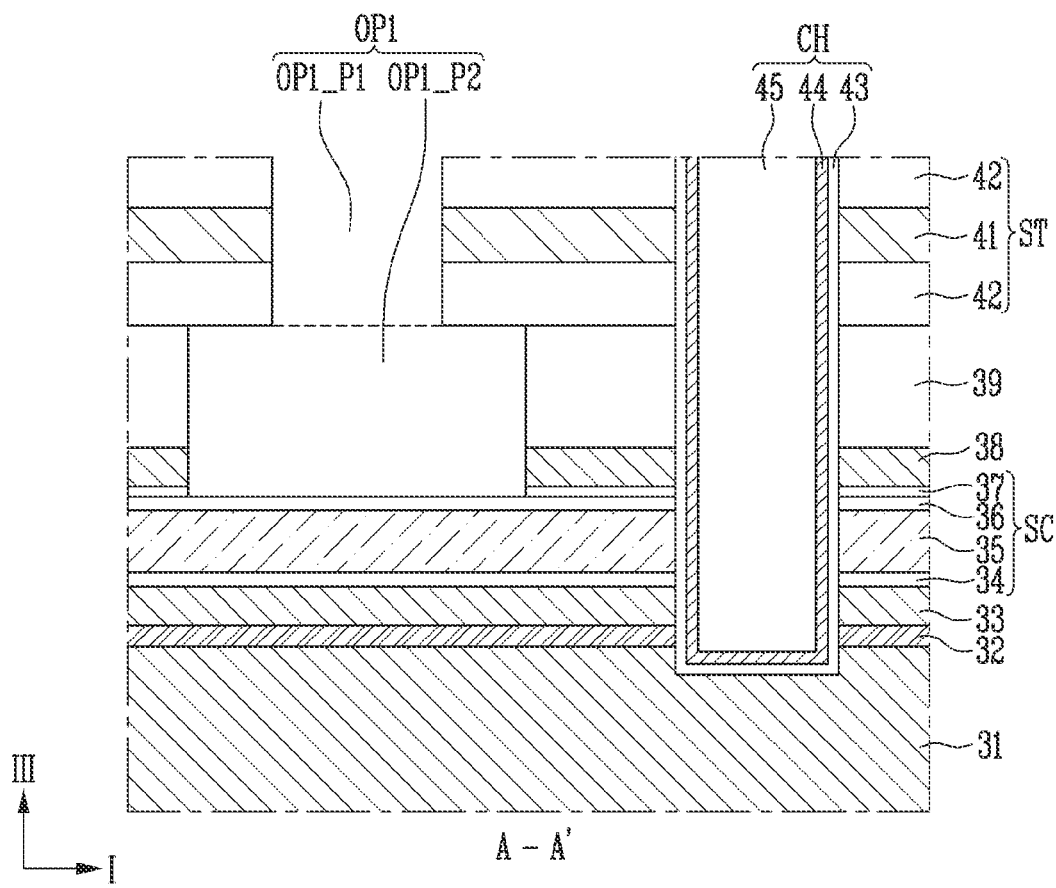

Referring to FIGS. 5A and 5B, a first opening OP1 passing through the stack ST is formed. The first opening OP1 may be formed to expose the etch stop layer 40. Subsequently, the etch stop layer 40 is removed through the first opening OP1. The first opening OP1 may include a first portion OP1_P1 corresponding to the stack ST, and a second portion OP1_P2 corresponding to the interlayer insulating layer 39 and the second preliminary source layer 38. The second portion OP1_P2 may have a width wider than that of the first portion OP1_1.

Figure 6:
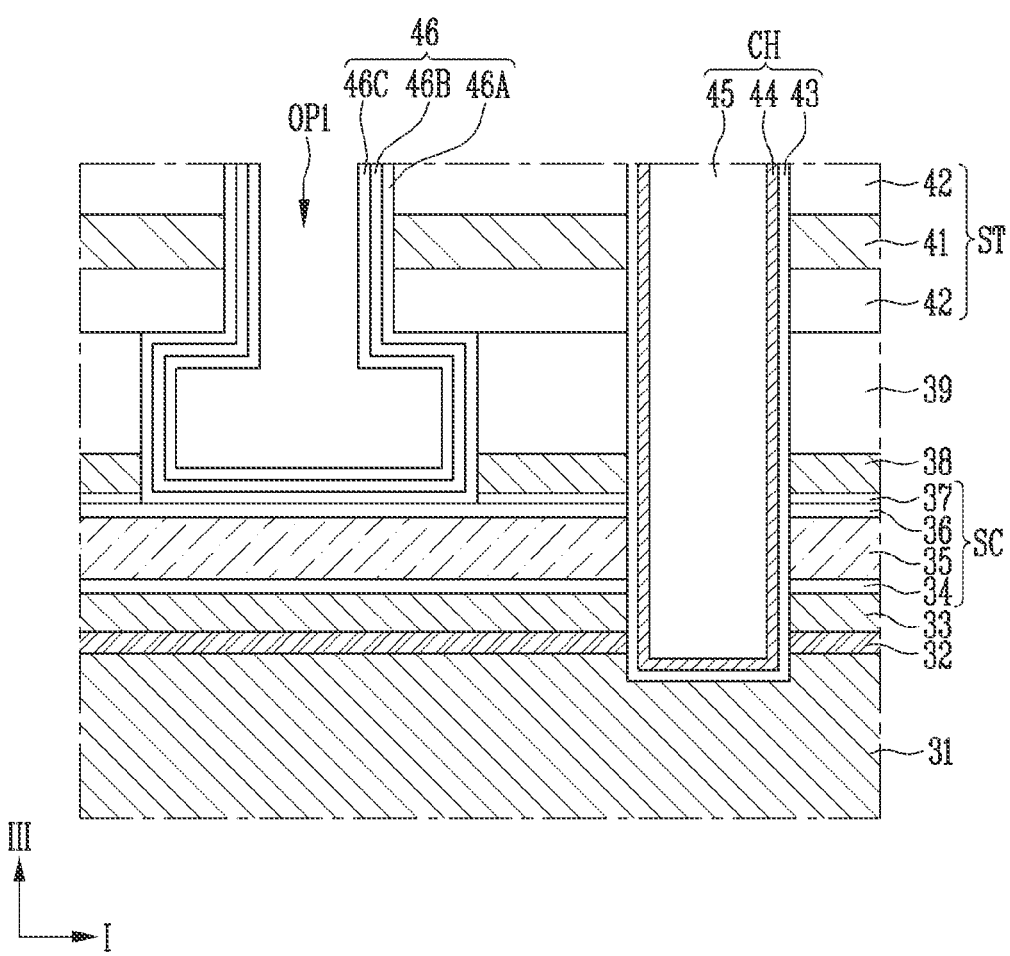
Figure 7:
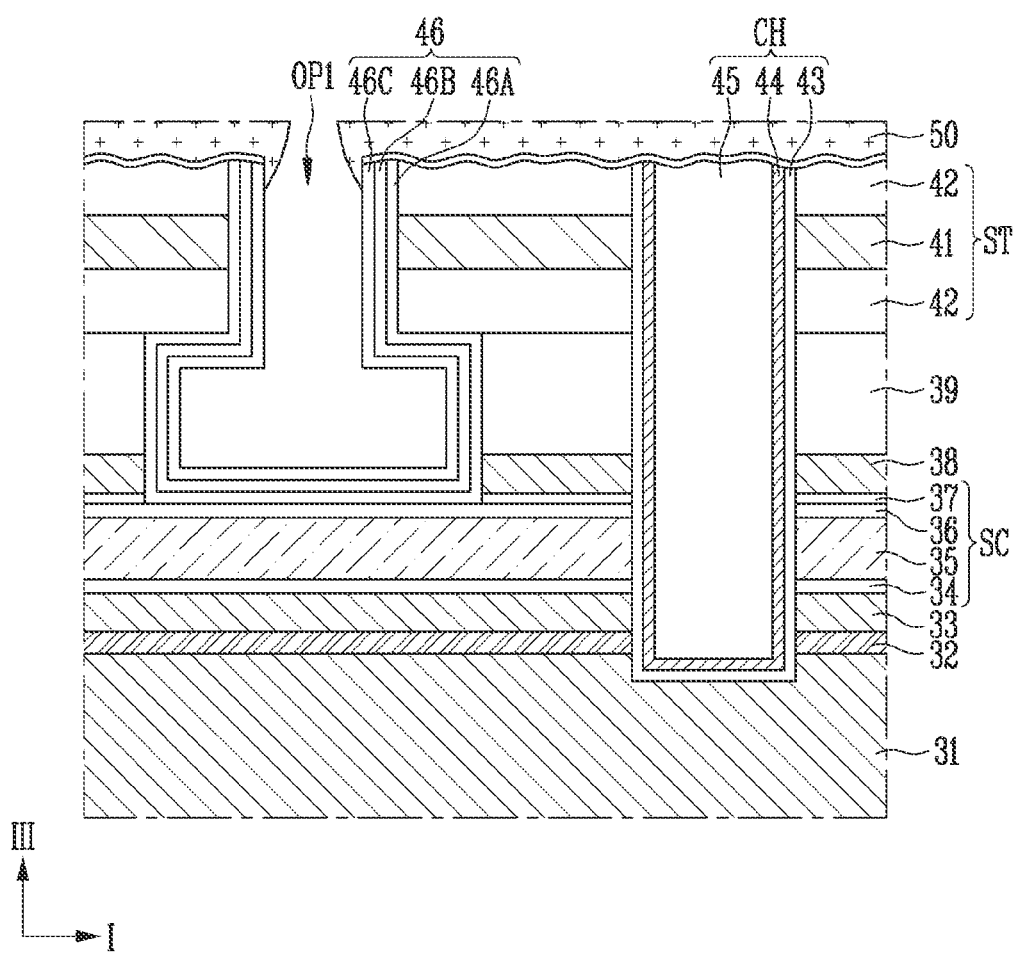
Figure 8:
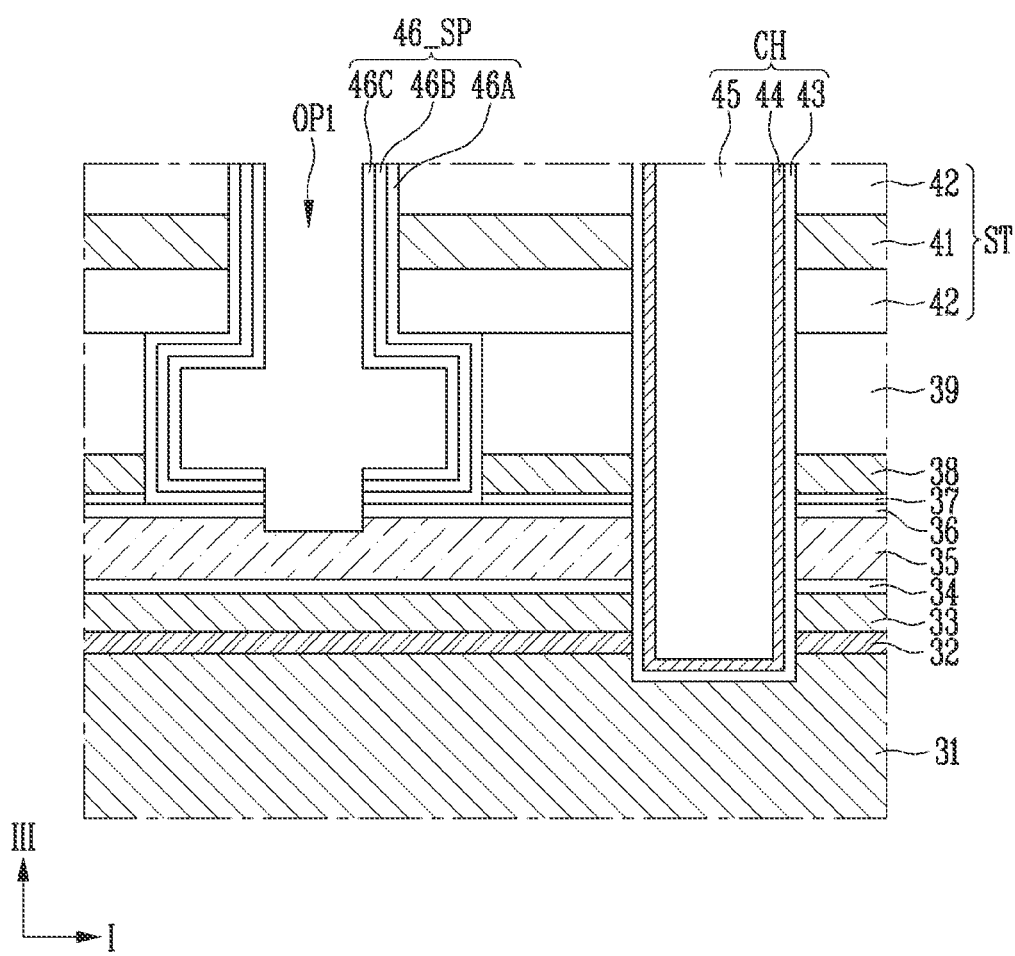

Referring to FIGS. 6 to 8, a protective spacer 46_SP is formed in the first opening OP1. The protective spacer 46_SP may be used to protect the sidewall of the stack ST exposed through the first opening OP1. The protective spacer 46_SP may have a single layer structure or a multi-layer structure.

First, referring to FIG. 6, the passivation layer 46 is formed along the inner surface of the first opening OP1. The passivation layer 46 may include a first passivation layer 46A, a second passivation layer 46B, or a third passivation layer 46, or may include a combination thereof. In an embodiment, the first passivation layer 46A may be a nitride layer including silicon nitride and the like, the second passivation layer 46B may be an oxide layer including silicon oxide and the like, and the third passivation layer 46C may be a nitride layer including silicon nitride and the like.

Subsequently, referring to FIG. 7, a mask pattern 50 is formed. The mask pattern 50 may be formed on the stack ST, and cover the top of the first opening OP1. The mask pattern 50 may be formed by depositing a mask material in a manner having poor step coverage. In an embodiment, the mask pattern 50 may be formed through a Plasma Enhanced Chemical Vapor deposition (PE-CVD) method. The mask pattern 50 may include a carbon layer.

Subsequently, referring to FIG. 8, the protective spacer 46_SP is formed by etching the passivation layer 46 using the mask pattern 50 as an etch barrier. Subsequently, at least a portion of the sacrificial structure SC is etched using the protective spacer 46_SP as an etch barrier. Thereby, the first opening OP1 may extend into the sacrificial structure SC, and may pass through the third sacrificial layer 36. The extended first opening OP1 may expose the second sacrificial layer 35. Thereafter, the mask pattern 50 is removed.

Figure 9:
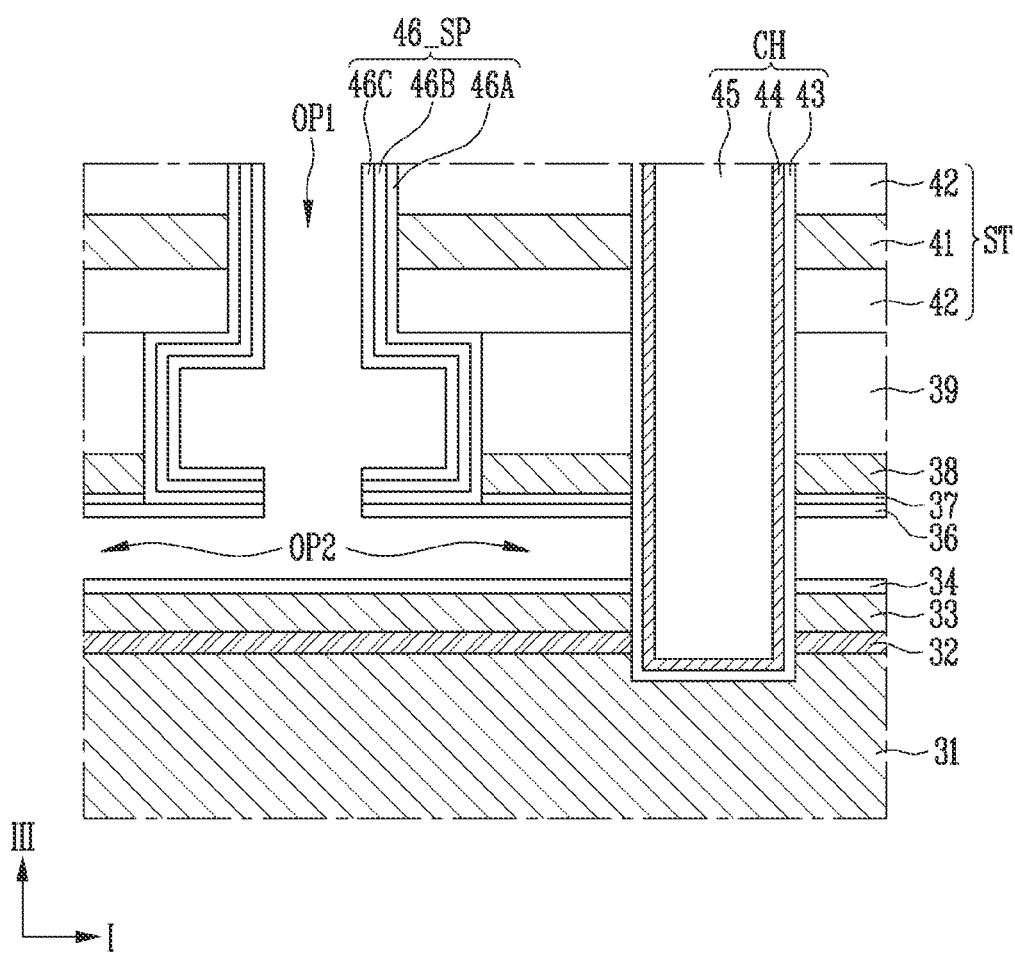

Referring to FIG. 9, the second opening OP2 is formed by removing the second sacrificial layer 35 exposed through the first opening OP1. The second opening OP2 may be formed by selectively etching the second sacrificial layer 35. The memory layer 43 may be exposed through the second opening OP2.

Figure 10:
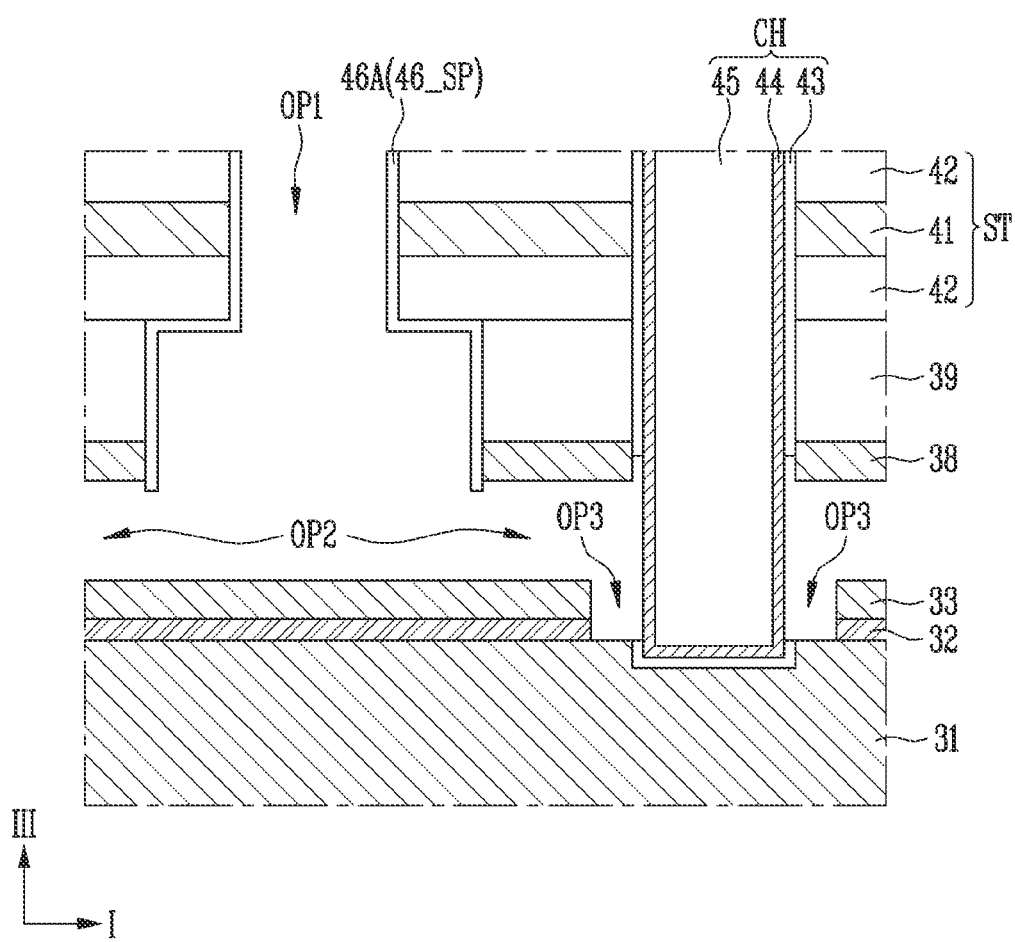

Referring to FIG. 10, the memory layer 43 is etched through the second opening OP2. Thereby, the channel layer 44 may be exposed. When the memory layer 43 is etched, the first sacrificial layer 34, the third sacrificial layer 36, and the fourth sacrificial layer 37 may be etched. Thereby, the first preliminary source layer 33 and the second preliminary source layer 38 may be exposed. When the memory layer 43 is etched, the first insulating passivation layer 32 may be protected by the first preliminary source layer 33.

When the memory layer 43 is etched, a portion of the protective spacer 46_SP may be etched. In an embodiment, the third passivation layer 46C and the second passivation layer 46B may be etched. The first passivation layer 46A may remain, and the stack ST and the interlayer insulating layer 39 may be protected by the remaining first passivation layer 46A.

When the memory layer 43 is etched, the third opening OP3 may be formed. The third opening OP3 may pass through the first preliminary source layer 33 and the first insulating passivation layer 32, and expose the first source layer 31. The third opening OP3 may be formed around the channel structure CH. The sidewall of the channel layer 44 may be exposed by the third opening OP3.

Figure 11:
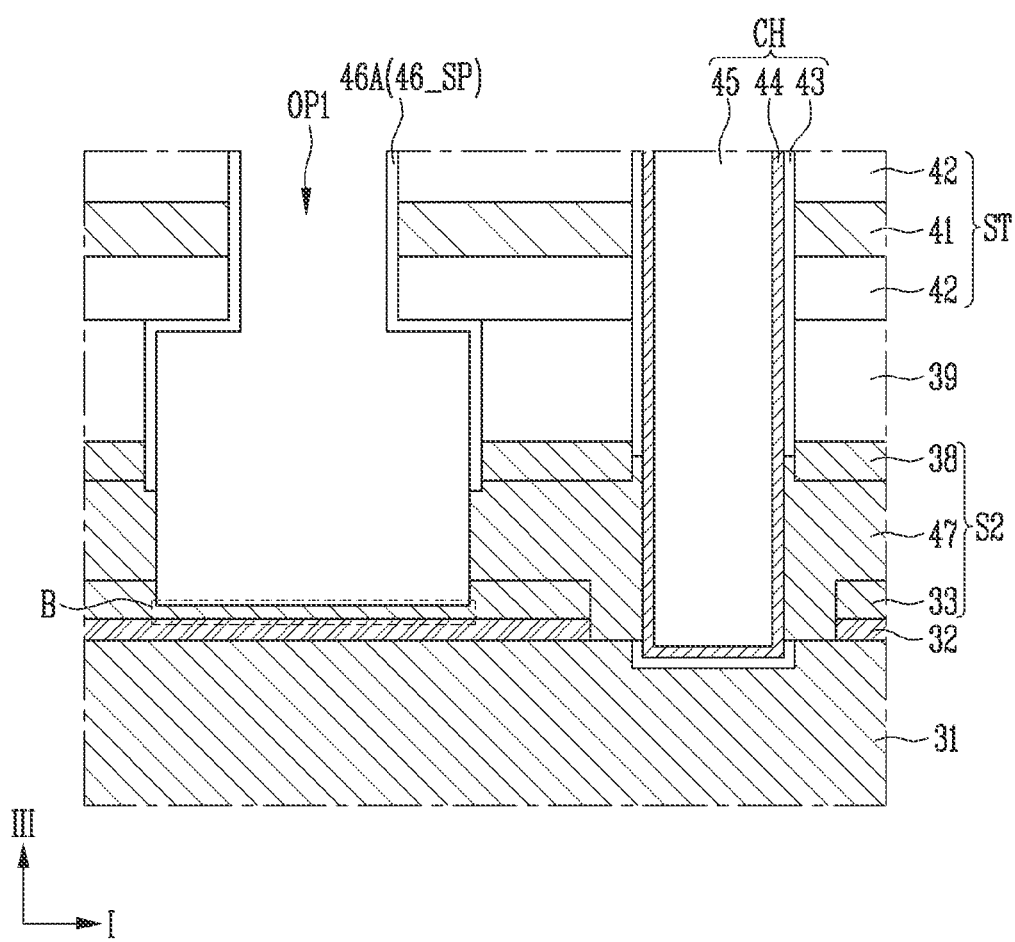

Referring to FIG. 11, the source layer 47 is formed in the second opening OP2 and the third opening OP3. The source layer 47 may be in contact with the first preliminary source layer 33 and the second preliminary source layer 38. The source layer 47 may form the second source layer S2 along with the first preliminary source layer 33 and the second preliminary source layer 38. The first source layer 31 and the second source layer S2 may form a source structure S.

In an embodiment, the conductive layer is deposited to fill the second opening OP2 and the third opening OP3. Subsequently, a portion of the conductive layer formed in the first opening OP1 is etched. Thereby, the source layer 47 may be formed. In the process of etching the conductive layer, a portion B of the first preliminary source layer 33 may be etched, and the first insulating passivation layer 32 may be exposed.

In an embodiment, the source layer 47 may be selectively grown in the second opening OP2 and the third opening OP3. In this case, the source layer 47 may be grown from the first source layer 31, the first preliminary source layer 33, and the second preliminary source layer 38. Because the source layer 47 is not grown in the first opening OP1, an etching process might not be performed.

Figure 12:
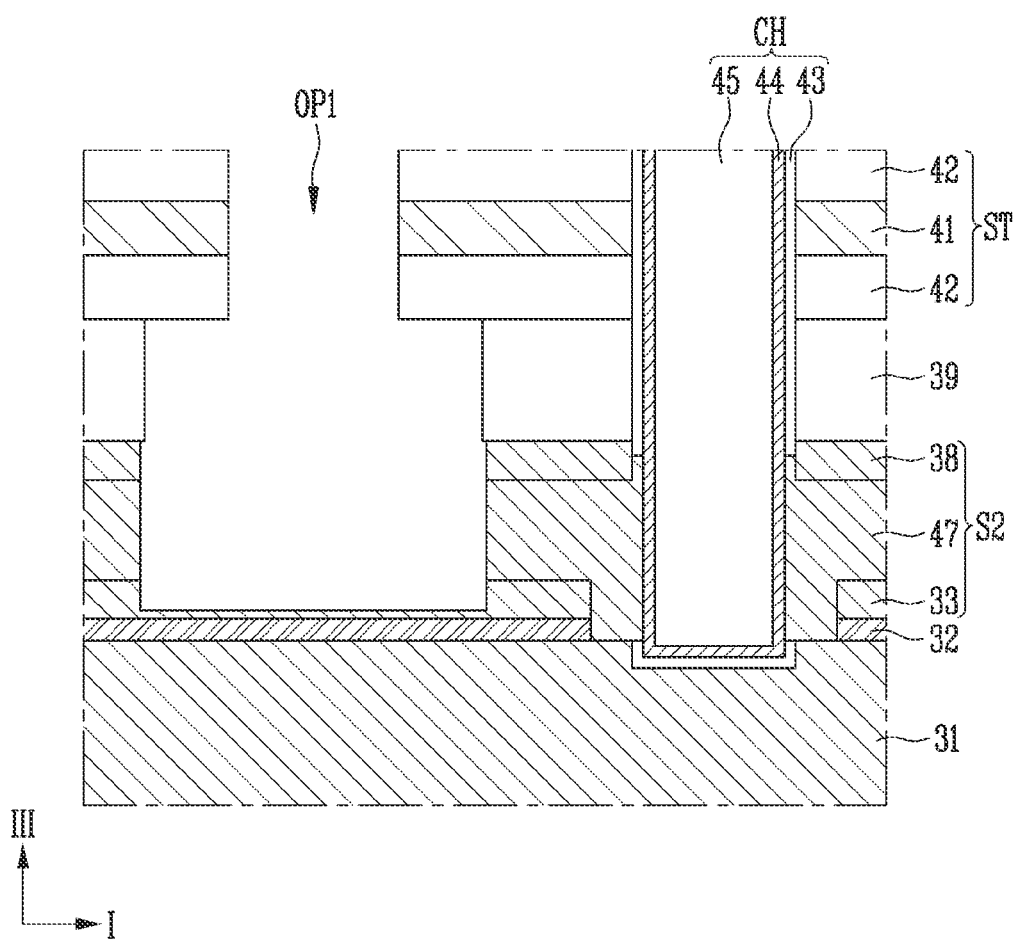

Referring to FIG. 12, the protective spacer 46_SP is removed. Thereby, the first material layers 41 and the second material layers 42 are exposed. Furthermore, the interlayer insulating layer 39 and the second preliminary source layer 38 may be exposed.

Figure 13:
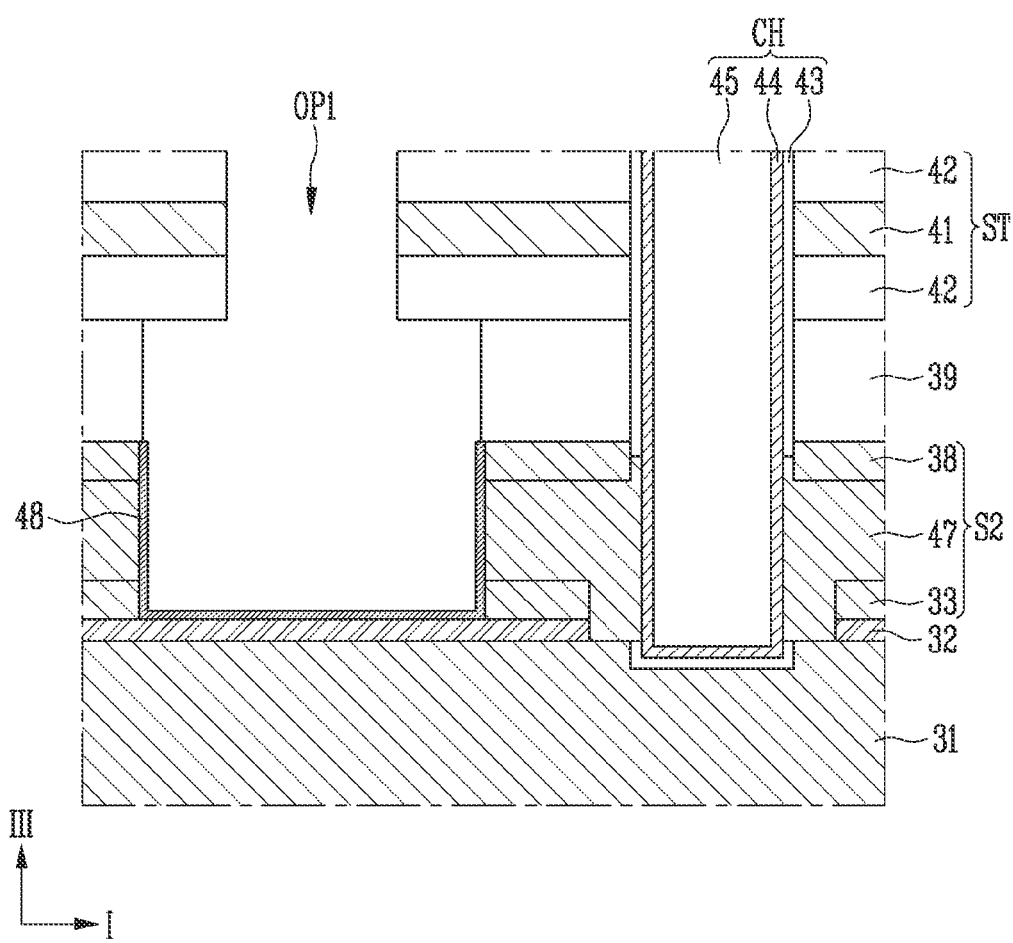

Referring to FIG. 13, the second insulating passivation layer 48 is formed in the first opening OP1. The second insulating passivation layer 48 may be formed on the source layer 47. In an embodiment, the second insulating passivation layer 48 may be formed using an oxidation process. The second insulating passivation layer 48 may be formed by oxidizing the surfaces of the first preliminary source layer 33, the source layer 47, and the second preliminary source layer 38. The second insulating passivation layer 48 may include an oxide layer.

For reference, when a portion B of the first preliminary source layer 33 is etched to expose the first insulating passivation layer 32 in the process of forming the source layer 47, the second insulating passivation layer 48 might not be formed on the surface of the first preliminary source layer 33.

Figure 14:
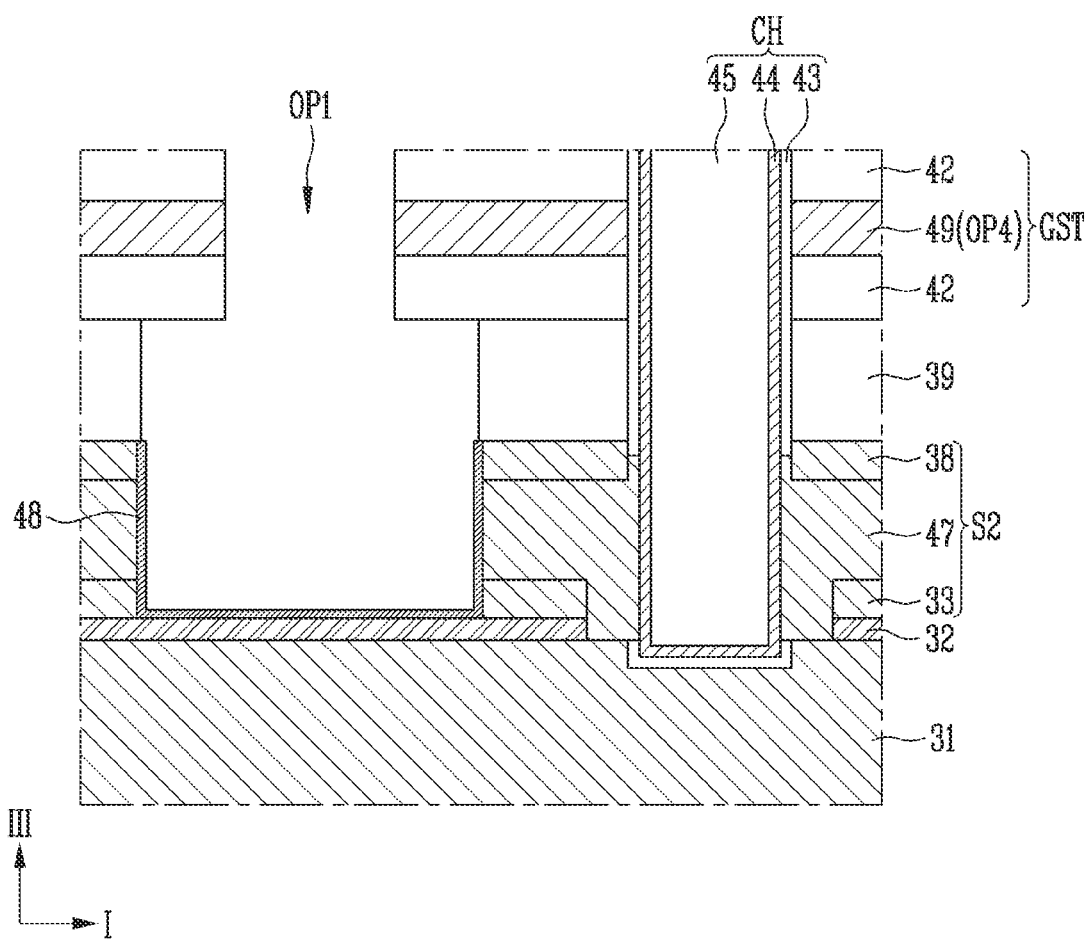

Referring to FIG. 14, the first material layers 41 are replaced with third material layers 49 through the first opening OP1. The third material layers 49 may include a conductive material such as doped polysilicon, tungsten, molybdenum, or metal. Thereby, the gate structure GST in which the second material layers 42 and the third material layers 49 are alternately stacked may be formed.

For instance, when the first material layers 41 include a sacrificial material and the second material layers 42 include an insulating material, the first material layers 41 are replaced with conductive layers. First, the first material layers 41 are removed to form fourth openings OP4. Subsequently, a conductive material is deposited in the first opening OP1 and the fourth openings OP4 to fill the fourth openings OP4. Thereafter, conductive layers are formed, respectively, in the fourth openings OP4 by etching a portion of the conductive material formed in the first opening OP1. Here, the widths of the conductive layers may be determined by the widths of the second material layers 42 or the interlayer insulating layer 39 positioned at the upper and lower portions. Because the second material layers 42 protrude into the first opening OP1 compared to the interlayer insulating layer 39, the lowermost conductive layer may be formed to have a narrower width than the other conductive layers. Furthermore, the sidewall of the lowermost conductive layer may include a curved surface induced in an etching process (see FIGS. 3A and 3B). For instance, when the first material layers 41 include a conductive material and the second material layers 42 include an insulating material, the first material layers 41 are silicided to form metal silicide layers. When the first material layers 41 are replaced with the third material layers 49, the first source layer 31 and the second source layer S2 may be protected by the first insulating passivation layer 32 and the second insulating passivation layer 48.

Figure 15:
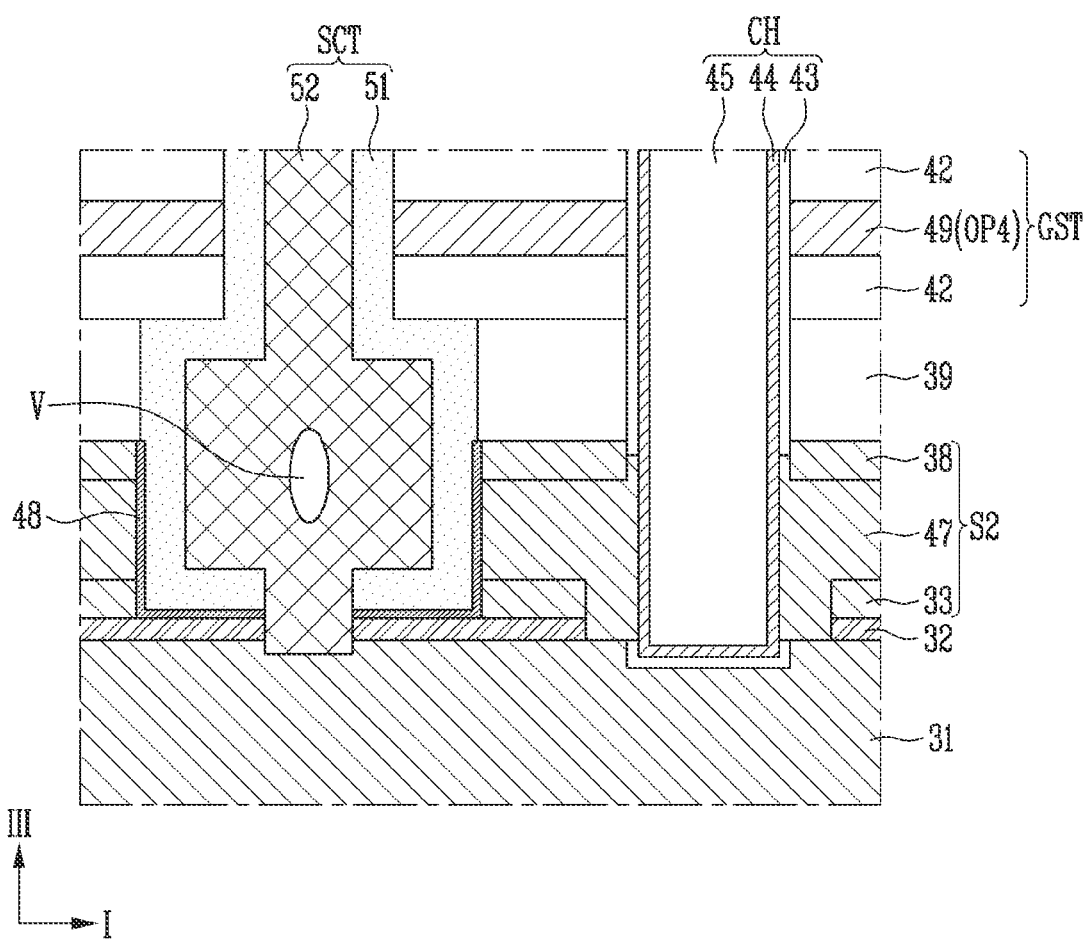
Figure 16:
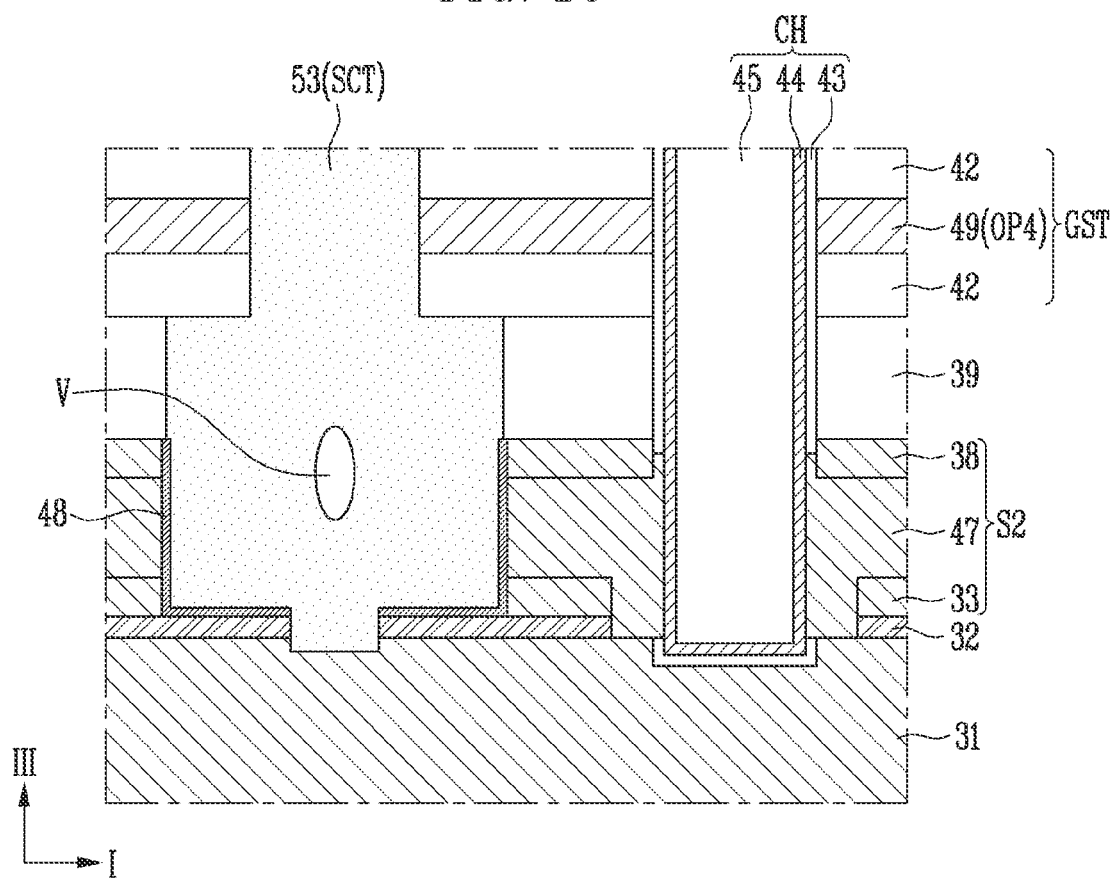

Referring to FIGS. 15 to 16, a source contact structure SCT is formed in the first opening OP1. The source contact structure SCT may pass through the gate structure GST, the interlayer insulating layer 39, and the second source layer S2. The source contact structure SCT may further pass through the first insulating passivation layer 32, and may be coupled to the first source layer 31. The source contact structure SCT may include an insulating material or a conductive material, or include a combination thereof.

Referring to FIG. 15, the source contact structure SCT may include an insulating spacer 51 and a conductive source contact layer 52. In an embodiment, after an insulating layer for the spacer is formed in the first opening OP1, the insulating spacer 51 is formed by etching the spacer insulating layer through an etchback process. When the spacer insulating layer is etched, the first insulating passivation layer 32 may be etched together, and the first source layer 31 may be exposed. Subsequently, the conductive source contact layer 52 electrically coupled to the first source layer 31 is formed in the insulating spacer 51. The conductive source contact layer 52 may include a void V therein.

Referring to FIG. 16, the source contact structure SCT may include an insulating layer 53. In an embodiment, the insulating layer 53 may be formed by depositing the insulating material in the first opening OP1. The insulating layer 53 may include a void V therein.

In the above-described manufacturing method, the sacrificial structure SC may be replaced with the source layer 47 through the first opening OP1. The first material layers 41 may be replaced with the third material layers 49 through the first opening OP1. Furthermore, damage to the first source layer 31 may be prevented in the process of replacing the first material layers 41 with the third material layers 49 using the first insulating passivation layer 32.

FIGS. 17A to 17E are views illustrating a method of manufacturing a semiconductor device in accordance with an embodiment of the present disclosure. Hereinbelow, repetitive descriptions are omitted.

Figure 17A:
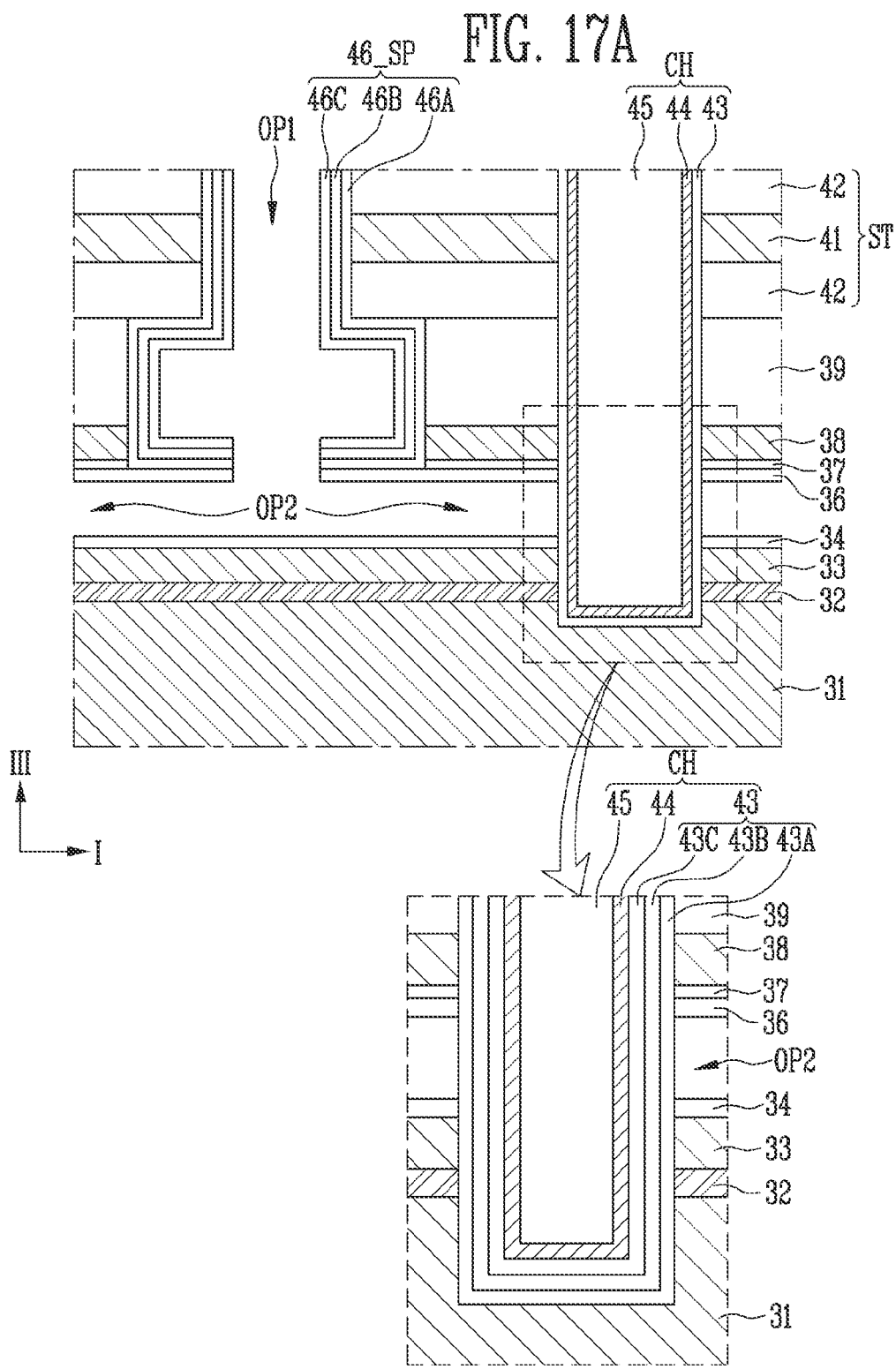

FIG. 17A may correspond to FIG. 9 described above. Referring to FIG. 17A, the memory layer 43 may be exposed through the second opening OP2. The memory layer 43 may include a blocking layer 43A, a data storage layer 43B, or a tunnel insulating layer 43C, or include a combination thereof. The blocking layer 43A may be exposed through the second opening OP2.

Figure 17B:
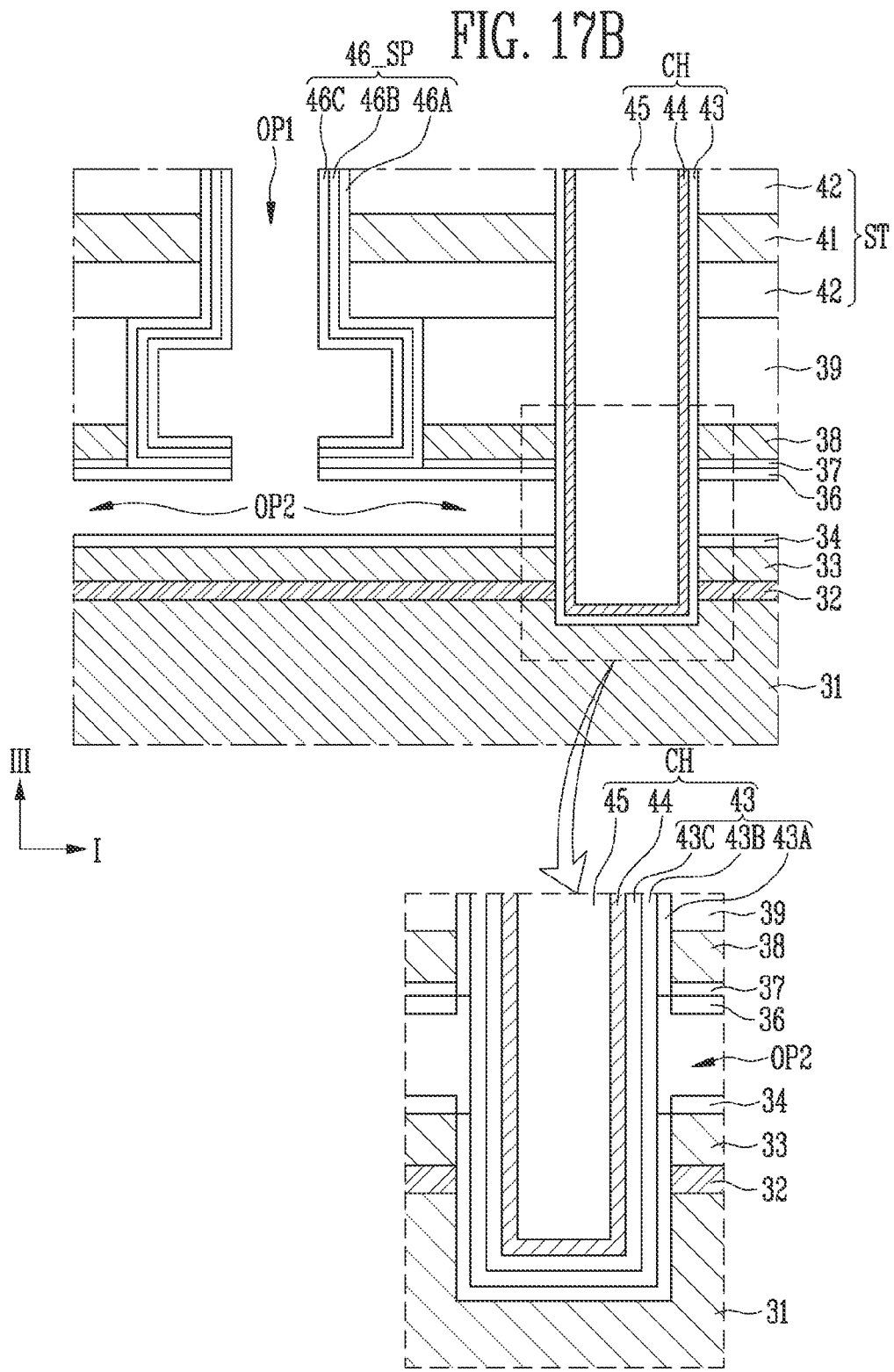

Referring to FIG. 17B, the blocking layer 43A is etched through the second opening OP2. Thereby, the data storage layer 43B may be exposed. When the blocking layer 43A is etched, the stack ST may be protected with the third passivation layer 46C. When the blocking layer 43A is etched, the first preliminary source layer 33 may be protected with the first sacrificial layer 34. When the blocking layer 43A is etched, the second preliminary source layer 38 may be protected with the third sacrificial layer 36.

Referring to FIG. 17C, the data storage layer 43B is etched through the second opening OP2. Thereby, the tunnel insulating layer 43C may be exposed. When the data storage layer 43B is etched, the first sacrificial layer 34 may be etched. Thereby, the first preliminary source layer 33 may be exposed. When the data storage layer 43B is etched, the third sacrificial layer 36 may be etched. Thereby, the fourth sacrificial layer 37 may be exposed. When the data storage layer 43B is etched, the third passivation layer 46C may be etched. Thereby, the second passivation layer 46B may be exposed.

Figure 17D:
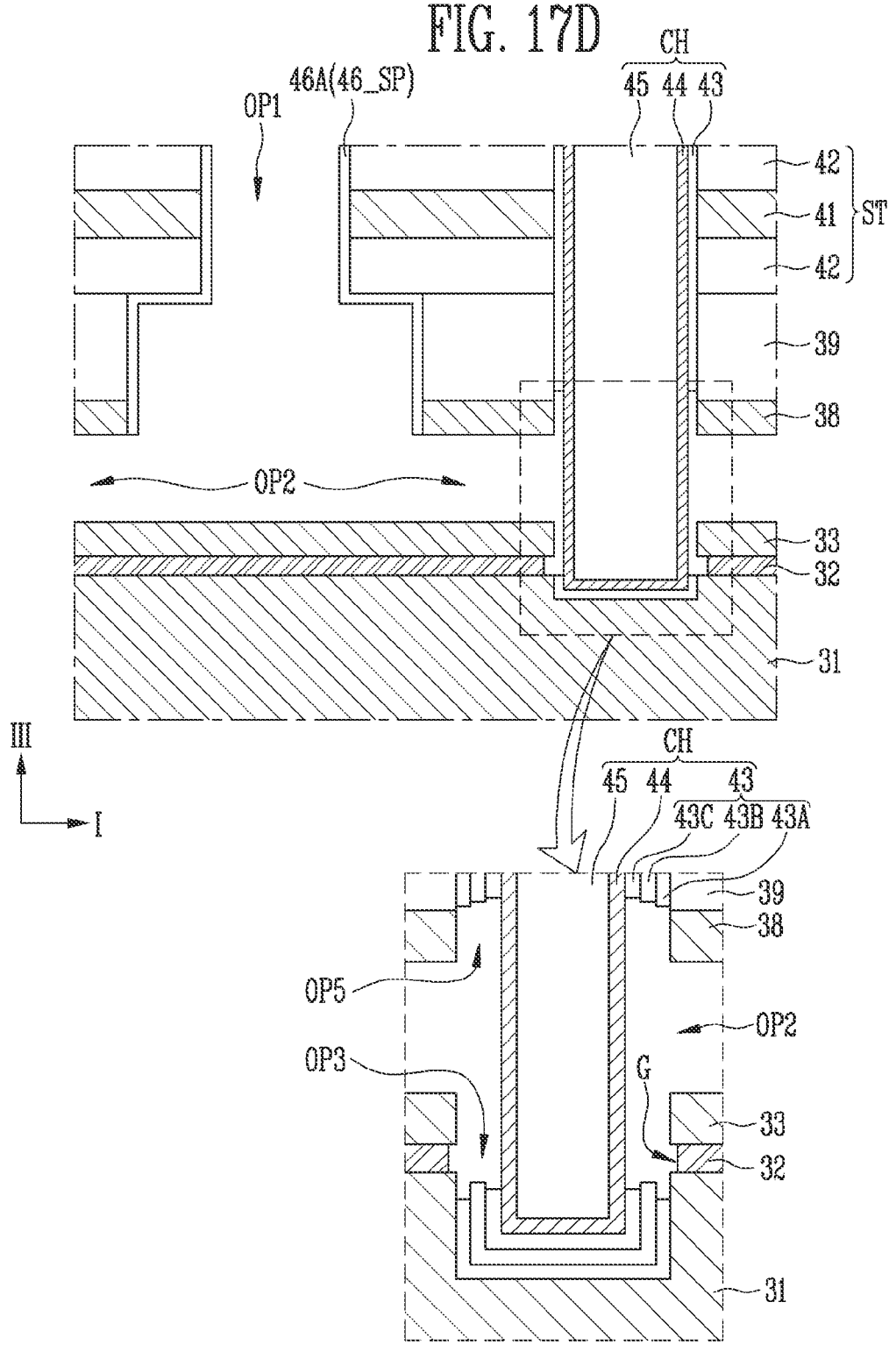

Referring to FIG. 17D, the tunnel insulating layer 43C is etched through the second opening OP2. Thereby, the channel layer 44 may be exposed. When the tunnel insulating layer 34C is etched, the fourth sacrificial layer 37 may be etched. Thereby, the second preliminary source layer 38 may be exposed. When the tunnel insulating layer 34C is etched, the second passivation layer 46B may be etched. Thereby, the first passivation layer 46A may be exposed.

When the tunnel insulating layer 34C is etched, the blocking layer 43A covering the sidewalls of the first preliminary source layer 33 and the first insulating passivation layer 32 may be etched. Thereby, the third opening OP3 may be formed to expose the first source layer 31. The surface of the blocking layer 43A, the surface of the data storage layer 43B, and the surface of the tunnel insulating layer 43C exposed through the third opening OP3 may be located at different levels. In the third direction III, the surface of the data storage layer 43B may protrude most into the third opening OP3, and the surface of the tunnel insulating layer 43C may be located between the surface of the data storage layer 43B and the surface of the blocking layer 43A.

Furthermore, when the tunnel insulating layer 43C is etched, the first insulating passivation layer 32 exposed through the third opening OP3 may be etched. Thus, a groove G may be formed in the sidewall of the third opening OP3. The first preliminary source layer 33 may protrude further into the third opening OP3 compared to the first insulating passivation layer 32.

When the tunnel insulating layer 34C is etched, the blocking layer 43A covering the sidewall of the second preliminary source layer 38 may be etched. Thereby, a fifth opening OP5 may be formed to expose the sidewall of the second preliminary source layer 38. The fifth opening OP5 may expose the interlayer insulating layer 39 according to the etching amount of the blocking layer 43A.

The surface of the blocking layer 43A, the surface of the data storage layer 43B, and the surface of the tunnel insulating layer 43C exposed through the fifth opening OP5 may be located at different levels. In the third direction III, the surface of the blocking layer 43A may protrude most into the fifth opening OP5, and the surface of the data storage layer 43B may be located between the surface of the tunnel insulating layer 43C and the surface of the blocking layer 43A.

Figure 17E:
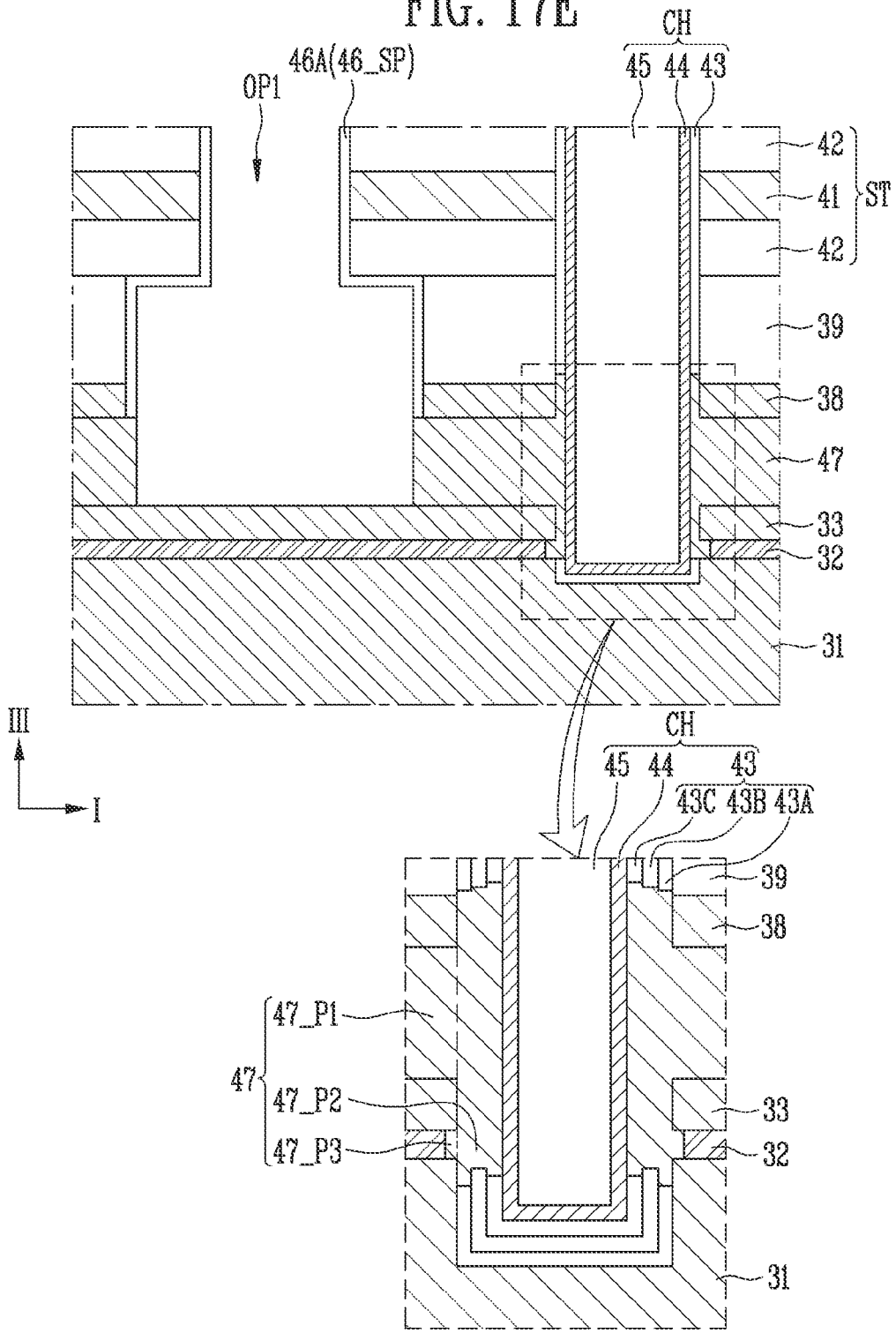

Referring to FIG. 17E, the source layer 47 is formed in the second opening OP2, the third opening OP3, and the fifth opening OP5. The source layer 47 may include a first portion 47_P1 and a second portion 47_P2, and may further include a third portion 47_P3. The first portion 47_P1 may be interposed between the first preliminary source layer 33 and the second preliminary source layer 38. The second portion 47_P2 may be coupled to the first portion 47_P1, and may enclose the sidewall of the channel layer 44. The third portion 47_P3 may be coupled to the second portion 47_P2, and may protrude from the second portion 47_P2 towards the first insulating passivation layer 32.

Although not shown in the drawings, a subsequent process such as a process of forming the source contact structure may be performed. The manufacturing method described with reference to FIGS. 12 to 16 may be applied to the subsequent process.

FIGS. 18A to 18F are views illustrating a method of manufacturing a semiconductor device according to an embodiment of the present disclosure. Hereinbelow, repetitive descriptions are omitted.

Figure 18A:
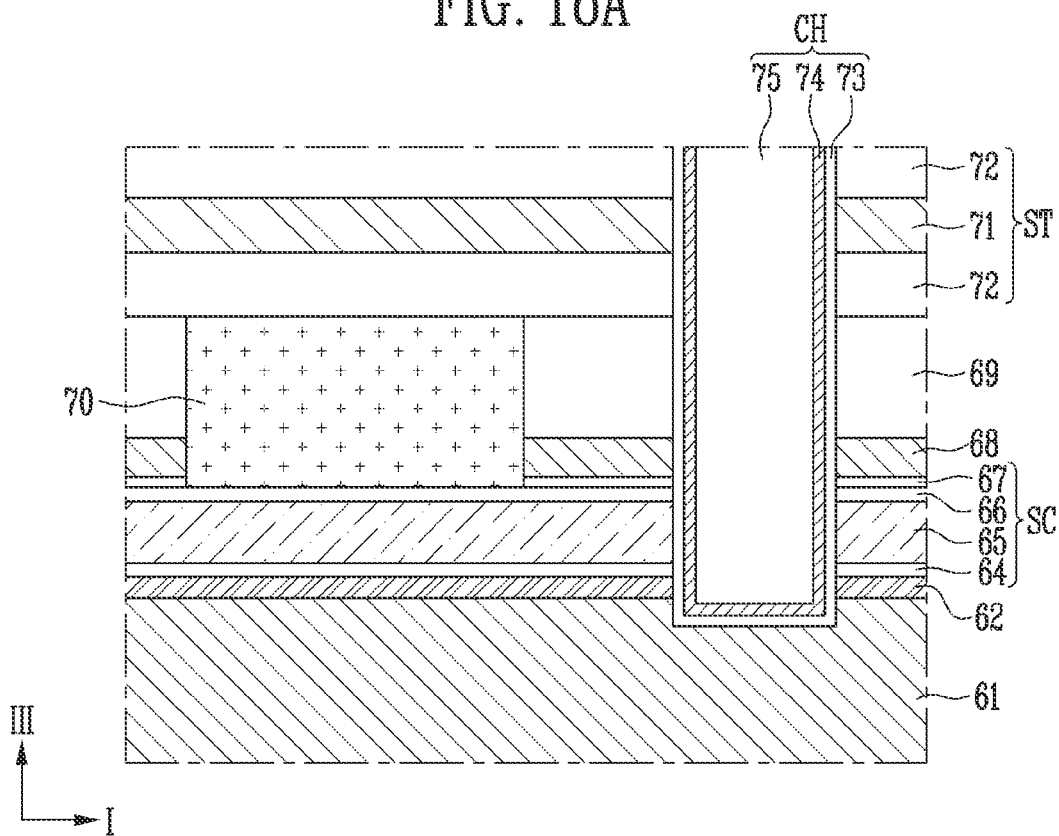

Referring to FIG. 18A, a first source layer 61 and a first insulating passivation layer 62 are formed. Subsequently, a sacrificial structure SC is formed on the first insulating passivation layer 62. The sacrificial structure SC may include a first sacrificial layer 64, a second sacrificial layer 65, a third sacrificial layer 66, or a fourth sacrificial layer 67, or may include a combination thereof. In an embodiment, the first sacrificial layer 64 may be a nitride layer including silicon nitride or the like. The second sacrificial layer 65 may be a doped polysilicon layer or an undoped polysilicon layer. The third sacrificial layer 66 may be a nitride layer including silicon nitride or the like. The fourth sacrificial layer 67 may be an oxide layer including silicon oxide or the like.

Subsequently, a preliminary source layer 68 may be formed on the sacrificial structure SC. Subsequently, an interlayer insulating layer 39 may be formed on the preliminary source layer 68. Thereafter, an etch stop layer 70 passing through the interlayer insulating layer 69 may be formed.

Subsequently, a stack ST is formed on the interlayer insulating layer 39. The stack ST may include first material layers 71 and second material layers 72 that are alternately stacked. Subsequently, a channel structure CH which passes through the stack ST, the interlayer insulating layer 69, the sacrificial structure SC, and the first insulating passivation layer 62 and extends to the first source layer 61 is formed. The channel structure CH may include a channel layer 74. The channel structure CH may further include a memory layer 73 or an insulating core 75, or may include a combination thereof.

Figure 18B:
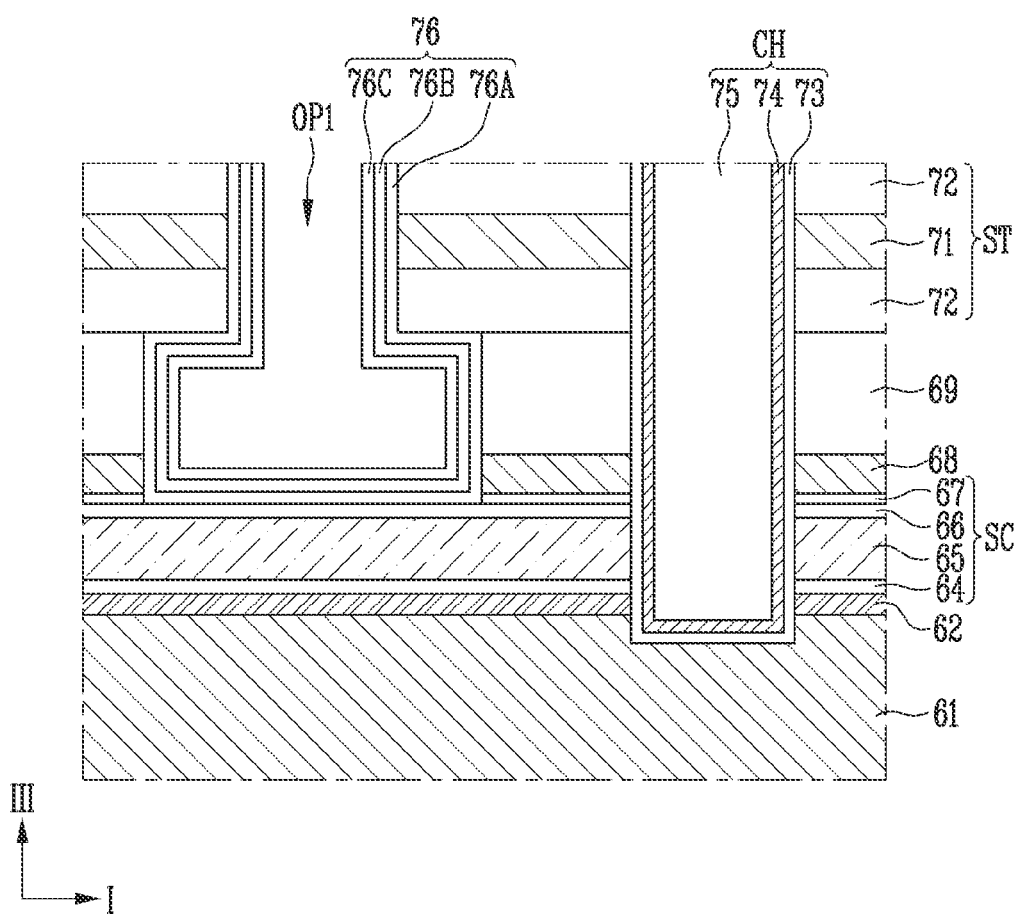

Referring to FIG. 18B, after forming a first opening OP1 passing through the stack ST, the etch stop layer 40 is removed. Thereafter, a passivation layer 76 is formed in the first openings OP1. The passivation layer 76 may include a first passivation layer 76A, a second passivation layer 76B, or a third passivation layer 76, or may include a combination thereof. In an embodiment, the first passivation layer 76A may be a nitride layer including silicon nitride and the like, the second passivation layer 76B may be an oxide layer including silicon oxide and the like, and the third passivation layer 76C may be a nitride layer including silicon nitride and the like.

Referring to FIG. 18C, the passivation layer 76 is etched to form a protective spacer 76_SP. Subsequently, the third sacrificial layer 66 is etched using the protective spacer 76_SP as an etch barrier to expose the second sacrificial layer 65. Thereafter, the second opening OP2 is formed by removing the second sacrificial layer 65 exposed through the first opening OP1. The memory layer 73 may be exposed through the second opening OP2.

Figure 18D:
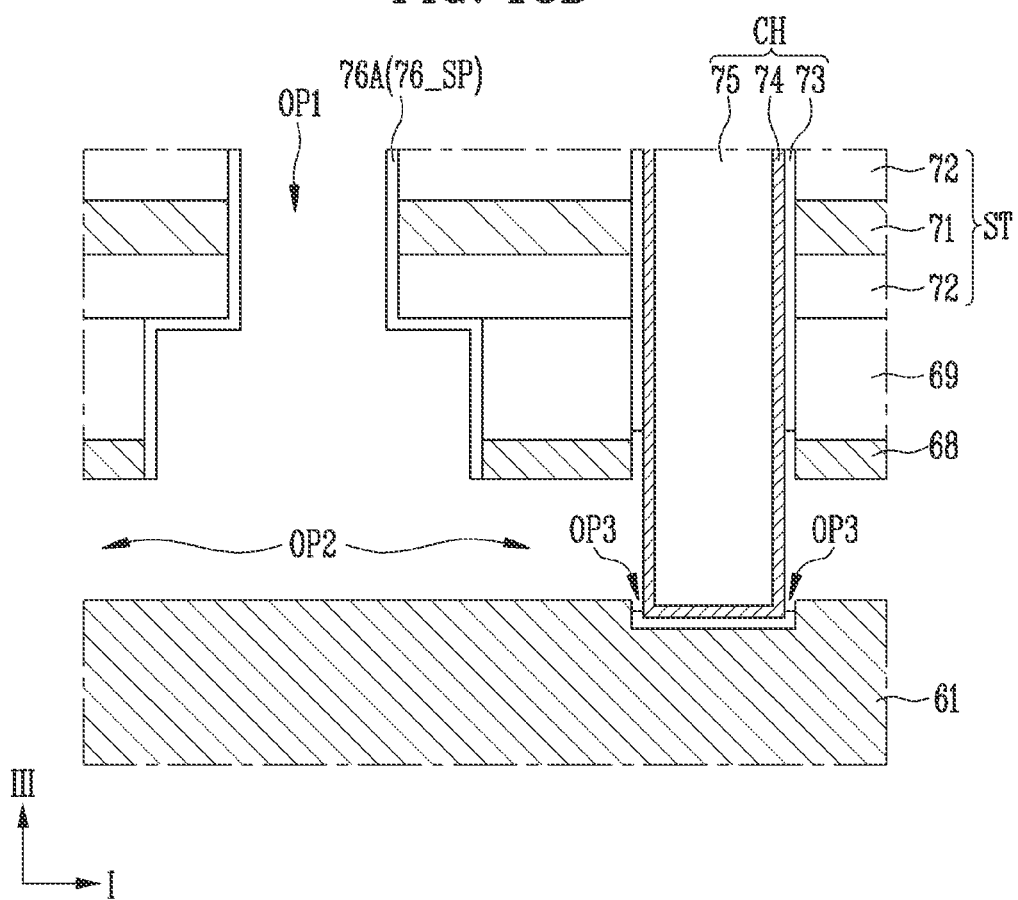

Referring to FIG. 18D, the memory layer 73 is etched through the second opening OP2. Thereby, the channel layer 74 may be exposed. When the memory layer 73 is etched, the first sacrificial layer 64, the third sacrificial layer 66, the fourth sacrificial layer 67, and the first insulating passivation layer 62 may be etched. Thereby, the first source layer 61 and the preliminary source layer 68 may be exposed. When the memory layer 73 is etched, the third passivation layer 76C and the second passivation layer 76B may be etched, and the first passivation layer 76A may remain.

When the memory layer 73 is etched, a third opening OP3 may be formed. The third opening OP3 may be formed around the channel structure CH. The sidewall of the first source layer 61 and the sidewall of the channel layer 74 may be exposed through the third opening OP3.

Figure 18E:
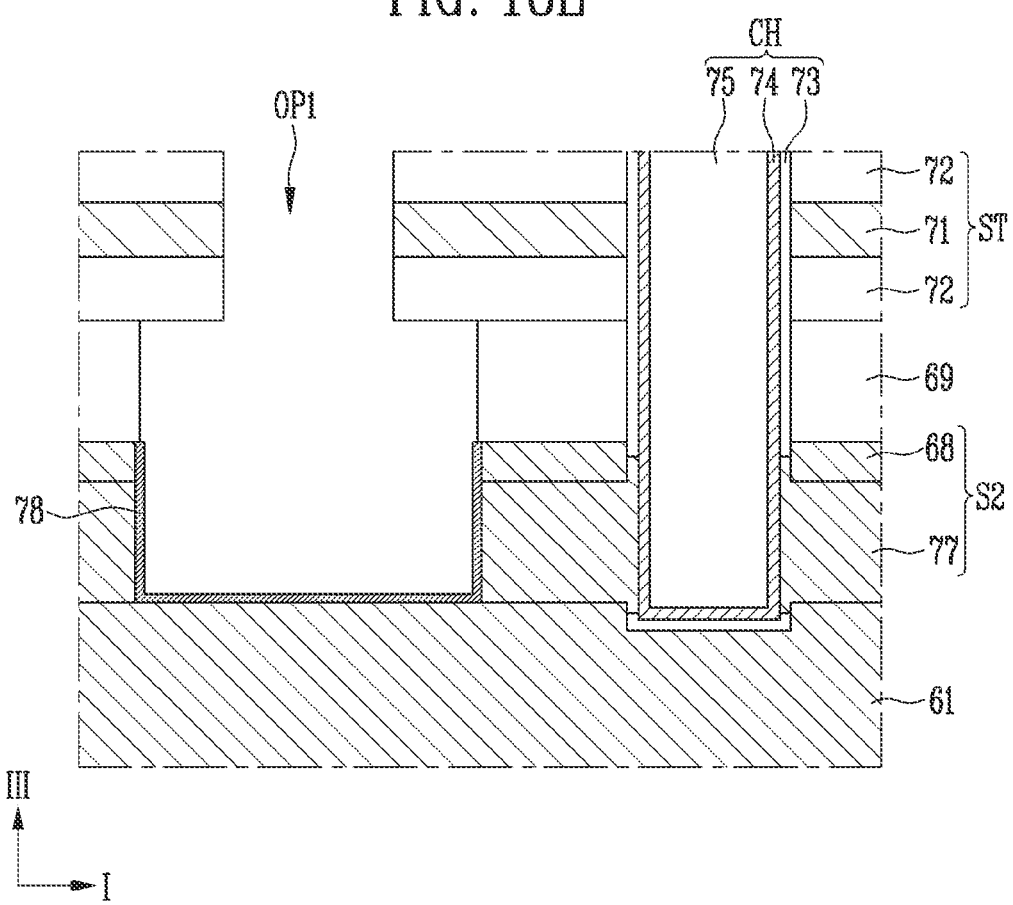

Referring to FIG. 18E, a source layer 77 is formed in the second opening OP2 and the third opening OP3. The source layer 77 may be in contact with the preliminary source layer 68. The source layer 77 may be used as the second source layer S2 together with the preliminary source layer 68. The second source layer S2 may be in contact with the first source layer 61. The first source layer 61 and the second source layer S2 may form a source structure S.

Subsequently, the protective spacer 76_SP is removed. Subsequently, a second insulating passivation layer 78 is formed in the first opening OP1. The second insulating passivation layer 78 may be formed on the surface of the first source layer 61 and the surface of the source layer 47.

Figure 18F:
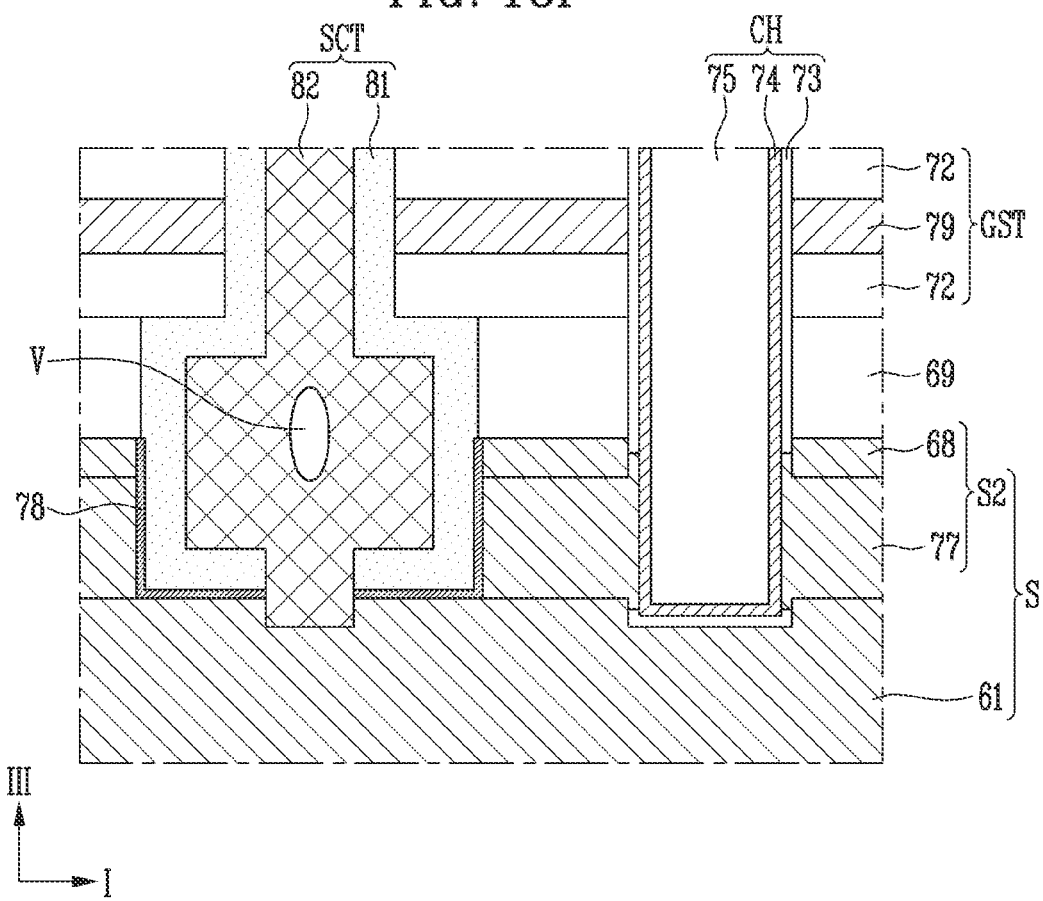

Referring to FIG. 18F, the first material layers 71 are replaced with third material layers 79 through the first opening OP1. When the first material layers 71 are replaced with the third material layers 79, the first source layer 61 and the second source layer S2 may be protected by the second insulating passivation layer 78.

Thereafter, a source contact structure SCT is formed in the first opening OP1. The source contact structure SCT may pass through the gate structure GST, the interlayer insulating layer 69, and the second source layer S2. The source contact structure SCT may be coupled to the first source layer 61. In an embodiment, the source contact structure SCT may include an insulating spacer 81 and a conductive source contact layer 82. The conductive source contact layer 82 may include a void V therein. In an embodiment, the source contact structure SCT may include an insulating layer.

In the above-described manufacturing method, the sacrificial structure SC may be replaced with the source layer 77 through the first opening OP1. The first material layers 71 may be replaced with the third material layers 79 through the first opening OP1. Furthermore, damage to the first source layer 61 may be prevented in the process of replacing the first material layers 71 with the third material layers 79 using the second insulating passivation layer 78.

Figure 19:
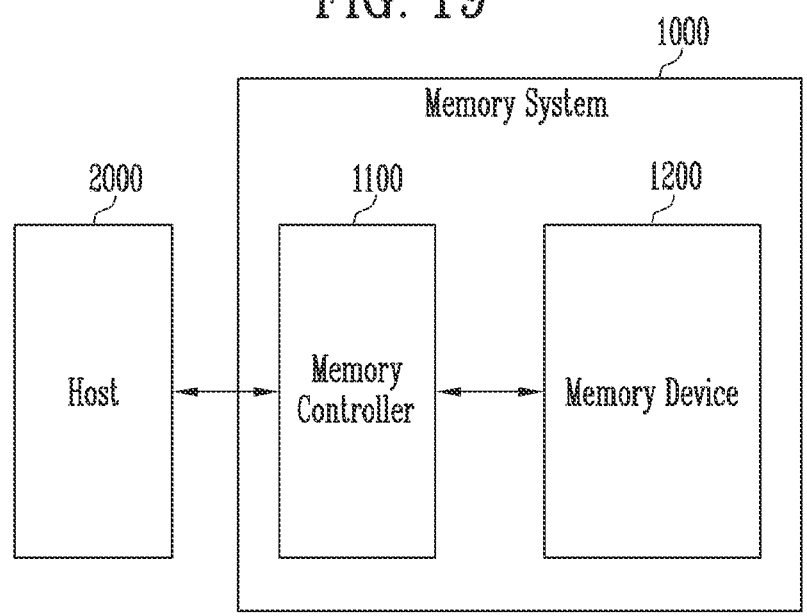
FIG. 19 is a diagram illustrating a memory system in accordance with an embodiment of the present disclosure.

FIG. 19 is a diagram illustrating a memory system 1000 in accordance with an embodiment of the present disclosure.

Referring to FIG. 19, the memory system 1000 may include a memory device 1200 configured to store data, and a memory controller 1100 configured to communicate between the memory device 1200 and a host 2000.

The host 2000 may be a device or system configured to store data in the memory system 1000 or retrieve data from the memory system 1000. The host 2000 may generate requests for various operations and output the generated requests to the memory system 1000. The requests may include a program request for a program operation, a read request for a read operation, and an erase request for an erase operation. The host 2000 may communicate with the memory system 1000 through various interfaces such as a peripheral component interconnect express (PCIe) interface, an advanced technology attachment (ATA) interface, a serial ATA (SATA) interface, a parallel ATA (PATA) interface, a serial attached SCSI (SAS) interface, a non-volatile memory express (NVMe) interface, a universal serial bus (USB) interface, a multi-media card (MMC) interface, an enhanced small disk interface (ESDI), or an integrated drive electronics (IDE) interface.

The host 2000 may include at least one of a computer, a portable digital device, a tablet PC, a digital camera, a digital audio player, a television, a wireless communication device, and a cellular phone, but embodiments of the present disclosure are not limited thereto.

The memory controller 1100 may control overall operations of the memory system 1000. The memory controller 1100 may control the memory device 1200 according to the request of the host 2000. The memory controller 1100 may control the memory device 1200 to perform a program operation, a read operation, an erase operation, and the like according to the request of the host 2000. Alternatively, the memory controller 1100 may perform a background operation for improving the performance of the memory system 1000 even if there is no request from the host 2000.

The memory controller 1100 may transmit a control signal and a data signal to the memory device 1200 to control the operation of the memory device 1200. The control signal and the data signal may be transmitted to the memory device 1200 through different input/output lines. The data signal may include a command, an address, or data. The control signal may be used to identify a section in which the data signal is input.

The memory device 1200 may perform the program operation, the read operation, and the erase operation under the control of the memory controller 1100. The memory device 1200 may be formed of a volatile memory device in which data stored therein is lost when supplied power is interrupted, or a non-volatile memory device in which data stored therein is maintained even when supplied power is interrupted. The memory device 1200 may be a semiconductor device having a structure described with reference to FIGS. 1A and 3B. The memory device 1200 may be a semiconductor device manufactured by the manufacturing method described with reference to FIGS. 4A to 18F. In an embodiment, the semiconductor device may include a first source layer, a second source layer, a first insulating passivation layer partially interposed between the first source layer and the second source layer, a gate structure located on the second source layer, and a source contact structure passing through the gate structure, the second source layer, and the first insulating passivation layer and coupled to the first source layer.

Figure 20:
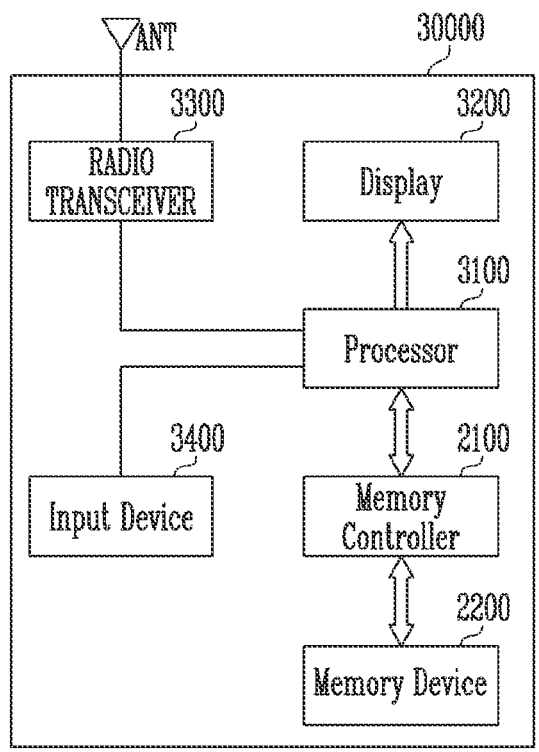
FIG. 20 is a diagram illustrating a memory system in accordance with an embodiment of the present disclosure.

FIG. 20 is a diagram illustrating a memory system 30000 in accordance with an embodiment of the present disclosure.

Referring to FIG. 20, the memory system 30000 may be implemented in the form of a cellular phone, a smartphone, a tablet personal computer (PC), a personal digital assistant (PDA) or a wireless communication device. The memory system 30000 may include a memory device 2200 and a controller 2100 configured to control the operation of the memory device 2200.

The controller 2100 may control a data access operation, e.g., a program operation, an erase operation, or a read operation, of the memory device 2200 under the control of a processor 3100.

Data programmed in the memory device 2200 may be outputted through a display 3200 under control of the controller 2100.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal outputted from the radio transceiver 3300 and transmit the processed signal to the controller 2100 or the display 3200. The controller 2100 may transmit a signal processed by the processor 3100 to the memory device 2200. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data outputted from the controller 2100, data outputted from the radio transceiver 3300, or data outputted form the input device 3400 is outputted through the display 3200.

In an embodiment, the controller 2100 capable of controlling the operation of the memory device 2200 may be embodied as a part of the processor 3100 or a chip provided separately from the processor 3100.

Figure 21:
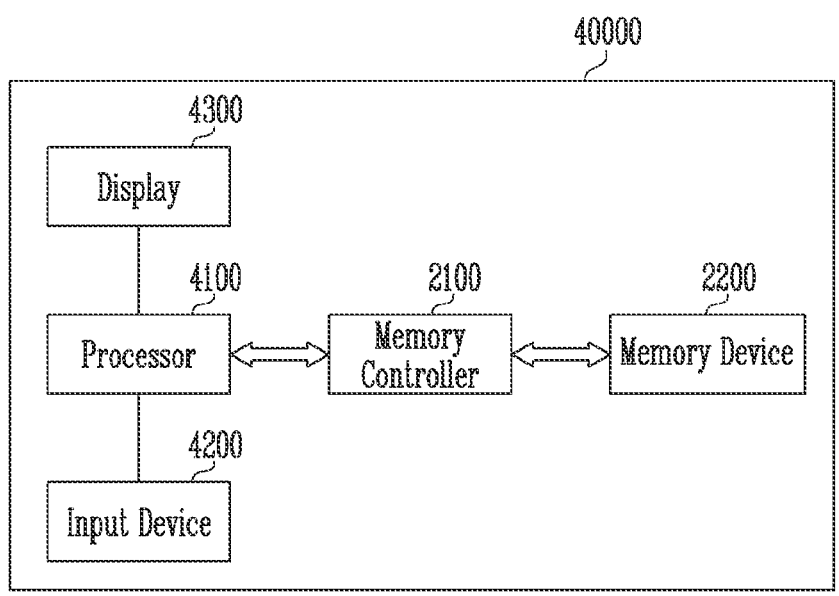
FIG. 21 is a diagram illustrating a memory system in accordance with an embodiment of the present disclosure.

FIG. 21 is a diagram illustrating a memory system 40000 in accordance with an embodiment of the present disclosure.

Referring to FIG. 21, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 2200, and a controller 2100 configured to control a data processing operation of the memory device 2200.

A processor 4100 may output data stored in the memory device 2200 through a display 4300, according to data input from an input device 4200. For example, the input device 4200 may be embodied in a pointing device such as a touch pad or a computer mouse, a keypad, or a keyboard.

The processor 4100 may control the overall operation of the memory system 40000 and control the operation of the controller 2100. In an embodiment, the controller 2100 capable of controlling the operation of the memory device 2200 may be embodied as a part of the processor 4100 or a chip provided separately from the processor 4100.

Figure 22:
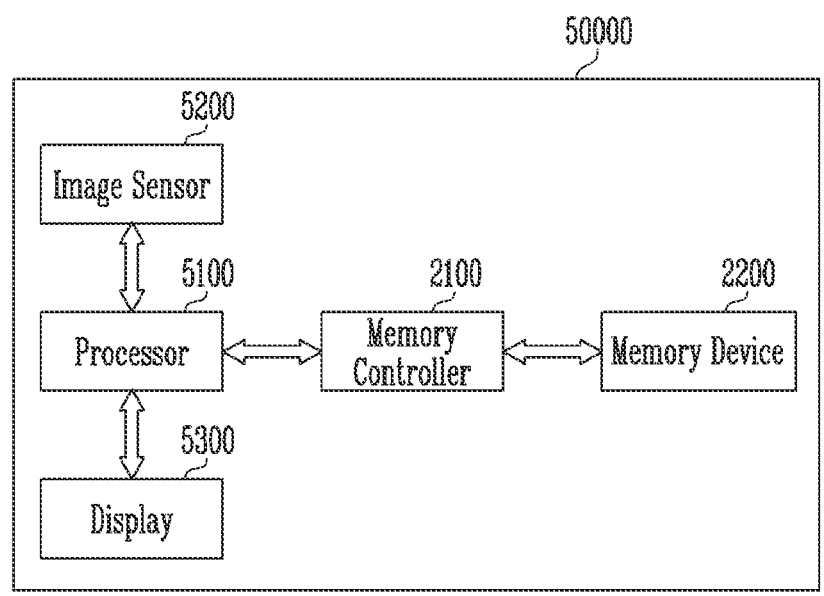
FIG. 22 is a diagram illustrating a memory system in accordance with an embodiment of the present disclosure.

FIG. 22 is a diagram illustrating a memory system 50000 in accordance with an embodiment of the present disclosure.

Referring to FIG. 22, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 2200, and a controller 2100 configured to control a data processing operation, e.g., a program operation, an erase operation, or a read operation, of the memory device 2200.

An image sensor 5200 of the memory system 50000 may convert an optical image into digital signals. The converted digital signals may be transmitted to a processor 5100 or the controller 2100. Under the control of the processor 5100, the converted digital signals may be outputted through a display 5300 or stored in the memory device 2200 through the controller 2100. Data stored in the memory device 2200 may be outputted through the display 5300 under the control of the processor 5100 or the controller 2100.

In an embodiment, the controller 2100 capable of controlling the operation of the memory device 2200 may be embodied as a part of the processor 5100 or a chip provided separately from the processor 5100.

Figure 23:
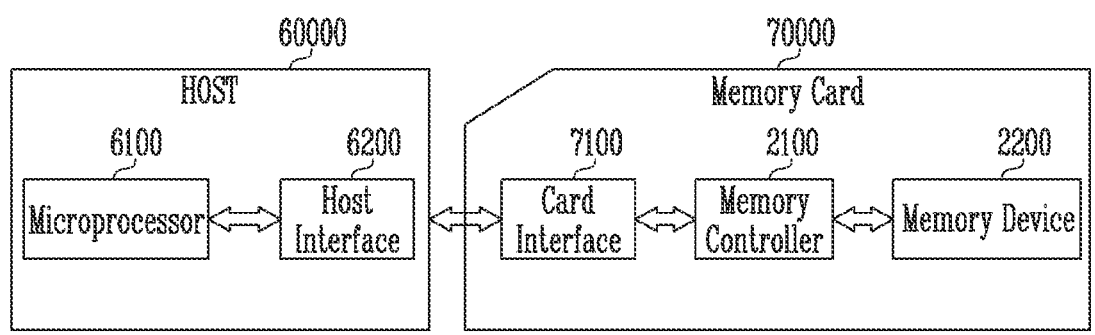
FIG. 23 is a diagram illustrating a memory system in accordance with an embodiment of the present disclosure.

FIG. 23 is a diagram illustrating a memory system 70000 in accordance with an embodiment of the present disclosure.

Referring to FIG. 23, the memory system 70000 may be embodied in a memory card or a smart card. The memory system 70000 may include a memory device 2200, a controller 2100, and a card interface 7100.

The controller 2100 may control data exchange between the memory device 2200 and the card interface 7100. In an embodiment, the card interface 7100 may be a secure digital (SD) card interface or a multi-media card (MMC) interface, but the present disclosure is not limited thereto.

The card interface 7100 may interface data exchange between a host 60000 and the controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is coupled to a host interface 6200 of the host 60000 such as a PC, a tablet PC, a digital camera, a digital audio player, a cellular phone, console video game hardware or a digital set-top box, the host interface 6200 may perform data communication with the memory device 2200 through the card interface 7100 and the controller 2100 under the control of a microprocessor 6100.

By three-dimensionally stacking memory cells, the integration of a semiconductor device can be improved. Furthermore, a semiconductor device which has a stable structure and is improved in reliability can be provided.

What is claimed is:

1. A semiconductor device, comprising:
   a first source layer;
   a second source layer over the first source layer;
   a first insulating passivation layer partially interposed between the first source layer and the second source layer;
   a gate structure located over the second source layer; and
   a source contact structure passing through the gate structure, the second source layer, and the first insulating passivation layer, and coupled to the first source layer,
   wherein the first insulation passivation layer extends between the first source layer and at least a portion of the source contact structure.

2. The semiconductor device according to claim 1, wherein the second source layer passes through the first insulating passivation layer to be electrically coupled to the first source layer.

3. The semiconductor device according to claim 1, further comprising:
   a channel structure passing through the gate structure, the second source layer, and the first insulating passivation layer.

4. The semiconductor device according to claim 3, wherein the first insulating passivation layer is spaced apart from a sidewall of the channel structure.

5. The semiconductor device according to claim 3, wherein the second source layer comprises:
   a first portion interposed between the first source layer and the gate structure;
   a second portion coupled to the first portion and enclosing the sidewall of the channel structure; and
   a third portion protruding from the second portion towards the first insulating passivation layer.

6. The semiconductor device according to claim 1, wherein the source contact structure comprises:
   a conductive source contact layer electrically coupled to the first source layer; and
   an insulating spacer enclosing a sidewall of the conductive source contact layer.

7. The semiconductor device according to claim 6, further comprising:
   an interlayer insulating layer interposed between the second source layer and the gate structure.

8. The semiconductor device according to claim 7, wherein the insulating spacer comprises:
   a first portion passing through the gate structure; and
   a second portion passing through the interlayer insulating layer, wherein the second portion is wider than the first portion.

9. The semiconductor device according to claim 6, further comprising:
   a second insulating passivation layer interposed between the insulating spacer and the second source layer.

10. The semiconductor device according to claim 9, wherein the second insulating passivation layer extends between the insulating spacer and the first insulating passivation layer.

11. The semiconductor device according to claim 1, wherein the source contact structure is formed of an insulating material.

12. The semiconductor device according to claim 1, wherein the source contact structure comprises a first portion passing through the gate structure and a third portion passing through the second source layer, and the third portion is wider in width than the first portion.

13. The semiconductor device according to claim 1, further comprising:
   a second insulating passivation layer interposed between the source contact structure and the second source layer.

14. The semiconductor device according to claim 13, wherein the second insulating passivation layer extends between the source contact structure and the first insulating passivation layer.

15. The semiconductor device according to claim 1, wherein the gate structure comprises:
   conductive layers; and
   insulating layers alternately stacked with the conductive layers.

* * * * *